United States Patent
Januszewski et al.

(10) Patent No.: US 8,223,468 B2
(45) Date of Patent: Jul. 17, 2012

(54) POWER CONDITIONING CIRCUIT UTILIZING HIGH OERSTED RATING INDUCTORS

(75) Inventors: Michael W. Januszewski, Downers Grove, IL (US); James E. Redburn, II, Coppell, TX (US); James E. Redburn, III, legal representative, Coppell, TX (US); Leonard E. Webster, Chicago, IL (US); John E. MacCrisken, Palo Alto, CA (US)

(73) Assignee: Leveler LLC, Downers Grove, IL (US)

( * ) Notice: Subject to any disclaimer, the term of this patent is extended or adjusted under 35 U.S.C. 154(b) by 0 days.

(21) Appl. No.: 12/381,685

(22) Filed: Mar. 16, 2009

(65) Prior Publication Data
US 2009/0243758 A1    Oct. 1, 2009

Related U.S. Application Data

(60) Provisional application No. 61/069,465, filed on Mar. 14, 2008.

(51) Int. Cl.
*H02H 3/22* (2006.01)
(52) U.S. Cl. .......................................... 361/111
(58) Field of Classification Search .................. 361/111
See application file for complete search history.

(56) References Cited

U.S. PATENT DOCUMENTS

| | | | |
|---|---|---|---|
| 4,814,941 A | | 3/1989 | Speet et al. |
| 4,901,183 A | * | 2/1990 | Lee ................................. 361/56 |
| 5,038,245 A | * | 8/1991 | Gronskog ....................... 361/56 |
| 5,448,443 A | | 9/1995 | Muelleman |
| 5,490,030 A | | 2/1996 | Taylor et al. |
| 5,619,079 A | * | 4/1997 | Wiggins et al. ................. 307/89 |
| 6,142,130 A | * | 11/2000 | Ward ............................ 123/606 |
| 6,166,458 A | * | 12/2000 | Redburn et al. ............... 307/105 |
| 6,288,917 B1 | * | 9/2001 | Redburn et al. ................. 363/39 |
| 6,882,549 B2 | * | 4/2005 | Huggett et al. ................. 363/40 |
| 7,068,005 B2 | * | 6/2006 | Baker ........................... 318/611 |

* cited by examiner

*Primary Examiner* — Dharti Patel
(74) *Attorney, Agent, or Firm* — McAndrews, Held & Malloy, Ltd.

(57) ABSTRACT

A power conditioning circuit for conditioning power supplied by a power source at a nominal frequency over conductors in a polyphase system includes first and second phase conductors. First and second inductors are connected in series between the first and second phase conductors and first and second phase output lines, wherein all of the power supplied by the power source to the first and second phase output lines flows through the first and second inductors. An inductance of each of the first and second inductors increases when power at frequencies greater than the nominal frequency flows through the first and second phase conductors, thereby blocking power at frequencies greater than the nominal frequency from reaching the first and second phase output lines.

20 Claims, 26 Drawing Sheets

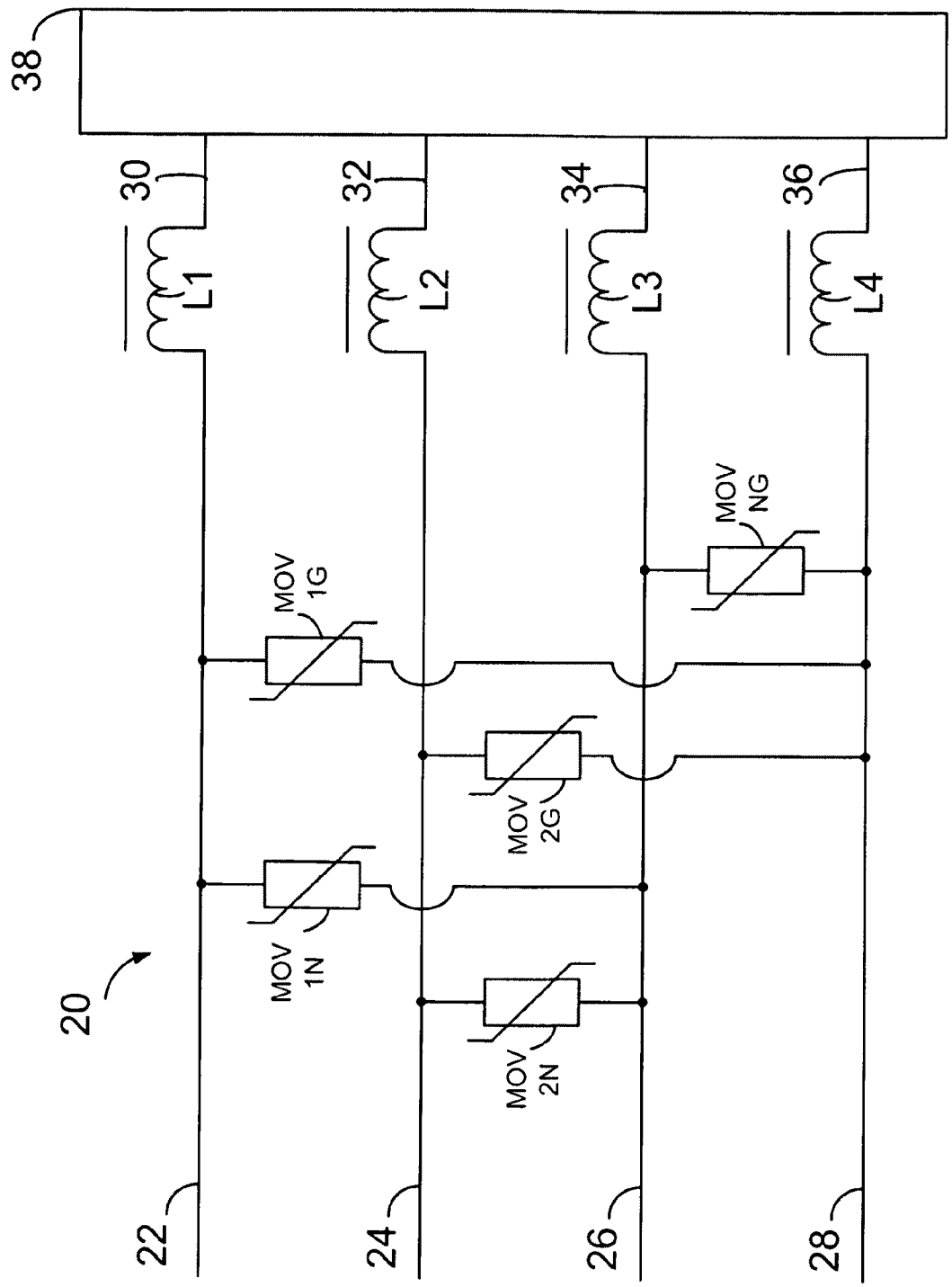

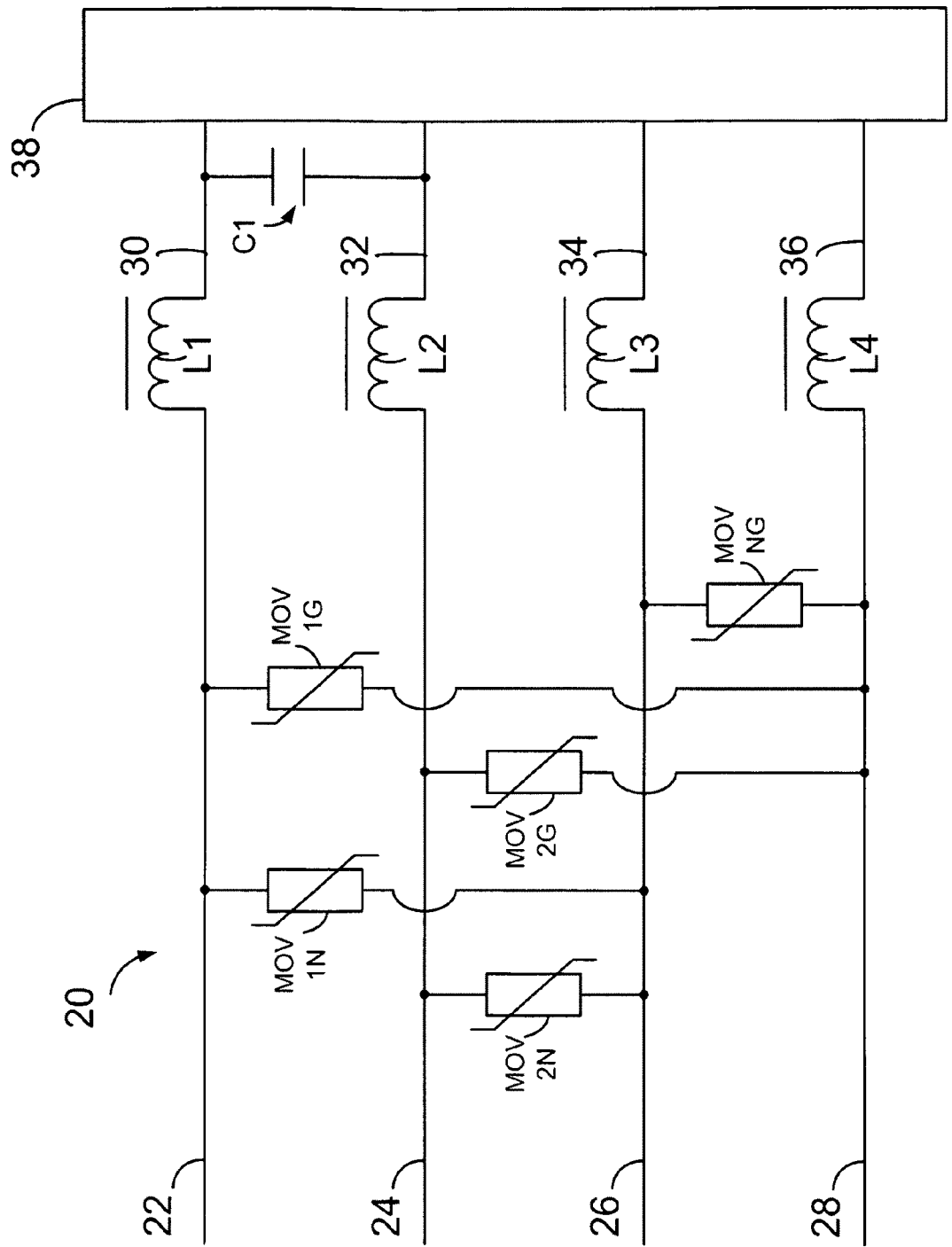

POWER CONDITIONING CIRCUIT UTILIZING HIGH OERSTED RATING INDUCTORS

CROSS REFERENCE TO RELATED APPLICATIONS

This application claims the benefit of a U.S. Provisional Patent Application No. 61/069,465 entitled "Power Conditioning Circuit Utilizing High Oersted Rating Inductors," filed on Mar. 14, 2008.

TECHNICAL FIELD

The present application relates generally to power conditioning circuits and methods, and more particularly to power conditioning circuits and methods that prevent industrial, commercial and residential loads from damage or disruption caused by voltage and current surges due to, for example, lightning strikes or other power disturbances.

BACKGROUND ART

Power conditioning circuits have long been used to protect sensitive load equipment from transients caused by lightning strikes, noise, and other power line disturbances. Traditionally, filter elements are used in the line and neutral conductors which trap and/or shunt unwanted power frequencies away from the load. See, for example, Speet et al. U.S. Pat. No. 4,814,941 and Taylor et al. U.S. Pat. No. 5,490,030.

Muelleman U.S. Pat. No. 5,448,443 discloses a power conditioning device and method including an isolation transformer having primary and secondary sides and a ground impedance connected between the secondary side of the isolation transformer at a safety ground and an earth ground. The Muelleman device prevents ground current loops by redirecting transient ground currents to neutral, but does not provide current limiting or noise suppression.

Redburn et al. U.S. Pat. No. 6,166,458, owned by the assignee of the present application and the disclosure of which is hereby incorporated by reference herein, discloses a power conditioning circuit for conditioning single-phase power supplied by a power source at a nominal frequency over line, neutral, and ground conductors. The power conditioning circuit includes first through third impedances coupled to the line, neutral, and ground conductors, respectively, and to output lines wherein each of the impedances prevents power at frequencies greater than the nominal frequency from reaching the output lines. Preferably, the first through third impedances comprise first through third inductors coupled in series with the line, neutral, and ground conductors, respectively, between the power source and the output lines. Means may also be provided for limiting voltages across the line, neutral and ground conductors. The limiting means may comprise at least one metal oxide varistor or at least one zener diode. The power conditioning circuit is simple in design, yet effective to limit damaging transients.

REFERENCE REGARDING FEDERALLY SPONSORED RESEARCH OR DEVELOPMENT

Not applicable

BRIEF DESCRIPTION OF THE DRAWINGS

FIG. 1 is a schematic diagram of a power conditioning circuit;

FIGS. 1A and 1B, are schematic diagrams of alternative embodiments of the power conditioning circuit of FIG. 1;

FIG. 12 is a schematic diagram of another embodiment of the power conditioning circuit of FIGS. 1, 1A, 1B, and 2 that is suitable for protecting high voltage appliances such as electric ovens, air conditioners, and the like;

SEQUENTIAL LISTING

Not applicable

DESCRIPTION

Figure 1A:
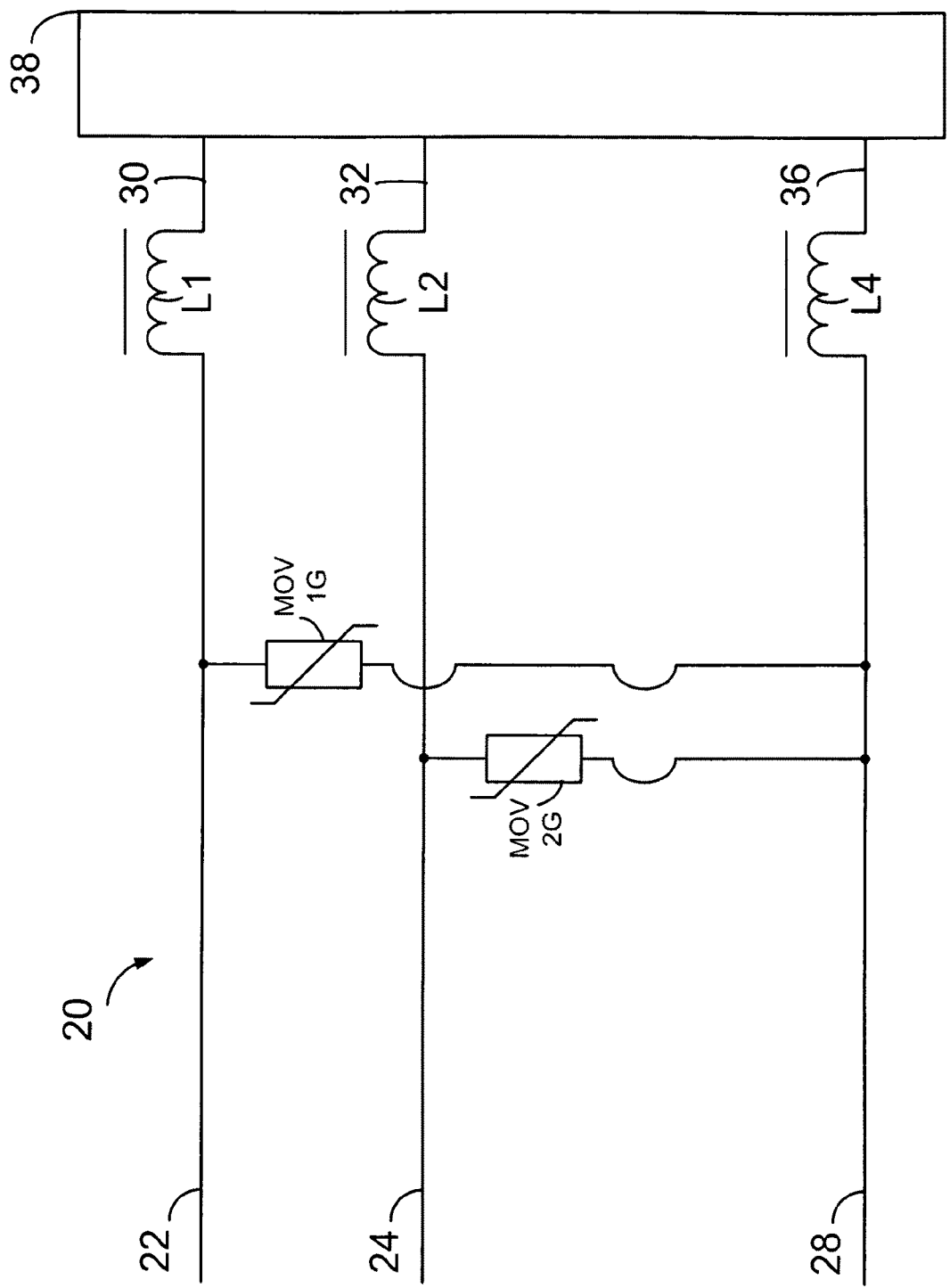

Referring to FIG. 1, a power conditioning circuit 20 is connected between first, second, neutral, and ground conductors 22, 24, 26, and 28, and output lines 30, 32, 34, and 36. The first, second, neutral, and ground conductors 22, 24, 26, 28 may be connected to a commercial source of power or any other power source. The output lines 30, 32, 34, and 36 may be connected to one or more loads 38.

The power conditioning circuit 20 further includes first, second, third, and fourth inductors L1, L2, L3, and L4 connected in series between first, second, neutral, and ground conductors 22, 24, 26, and 28 and the output lines 30, 32, 34, and 36. Metal oxide varistors MOV1N and MOV1G are connected across the first and neutral conductors 22, 26 and the first and ground conductors 22, 28, respectively. Similarly, metal oxide varistors MOV2N and MOV2G are connected across the second and neutral conductors 24, 26 and the second and ground conductors 24, 28, respectively. In addition, a metal oxide varistor MOVNG is connected across the neutral and ground conductors 26, 28.

In one embodiment of the power conditioning circuit 20, the nominal inductance values of the inductors L1, L2, and L3 are equal. For example, the inductance values of L1-L3 may be in the range of about 1.0 mH to 5.0 mH and the inductance value of the inductor L4 may be between 0.1 mH and 0.5 mH. Further, the metal oxide varistors MOV1N, MOV2N, MOV1G, and MOV2G must be sized large enough to dissipate large voltage spikes caused, for example, by a lightning strike, and should, for example, typically have a maximum continuous operating voltage (MCOV) that is appropriate for the expected RMS voltage of the commercial power source. In contrast the metal oxide varistor MOVNG that is connected between the neutral and ground conductors 26, 28 is not exposed to large voltage spikes and should typically have a MCOV of at least the RMS value of one "hot" conductor to RMS ground potential.

The power conditioning circuit 20 shown in FIG. 1 implements an inductor and varistor protected complementary-phase power system having a voltage centered on a neutral conductor nominally at a ground potential. This power system is typically used to deliver electric power at approximately 120/240 Volts RMS alternating current to residential areas in the United States to power domestic electrical appliances, for example, electric stoves, heating systems for swimming pools and hot tubs, electric washers and dryers, etc. The power conditioning circuit 20 of FIG. 1 protects electrically powered devices from lightning strikes and other voltage and current deviations as will be explained below.

In operation, transients appearing on any of the first, second, neutral, and ground conductors 22, 24, 26, 28 having one or more frequency components in excess of the nominal frequency (typically 60 Hz in the United States of America and 50 Hz in Europe) of power supplied thereto are attenuated by the inductors L1-L4 even when the amplitude of such transients is substantially greater than the rated voltage and current for the power conditioning circuit 20. The transients may be of a very high voltage variant typically caused by lightning strikes or they may be of a more common lower voltage deviation from the nominal frequency. The transients may be of such a short duration that they do not trigger a circuit breaker in a conventional circuit. In addition, the presence of metal oxide varistors alone in the conventional circuit may not be sufficient to prevent such transients from reaching loads in the conventional circuit. In such situations, additional protection is necessary to divert transients away from sensitive load equipment to prevent damage thereto.

The inductors L1-L4 are highly specialized inductors that are designed to simultaneously provide a low impedance path to a desired current flow at the nominal frequency and a high impedance path to unwanted energies at frequencies over 100 Hz. The inductors L1-L4 differ from standard inductors in the sense that the inductors L1-L4 do not "saturate" in the presence of expected transient levels. The inductors L1-L4 maintain a magnetic flux field at a strength and for a period of time that far exceeds the magnetic flux fields produced by standard inductors having the above-identified desired impedances.

Typically, a standard inductor is specified using a handful of parameters such as minimum RMS current, maximum RMS current, maximum inductance in Henries, DC Bias, core loss vs. copper loss ratio, resistance, and system voltage. In contrast, the inductors L1-L4 are characterized by minimum RMS current, maximum RMS current, RMS voltage, no DC bias, and are also non-linear because they have inductances that increase with frequency. The inductors L1-L4 can be constructed using powdered iron cores that are available from Micrometals, Inc. of Anaheim, Calif. 92807, for example, toroidal core part number T157-26. Because in the illustrated embodiment, the inductors L1-L3 are intended to share the same characteristics and construction, only the characteristics and construction of the inductor L1 is explained in detail below with reference to FIGS. 1C and 1D and 1E-1G. Turning to FIGS. 1C and 1D, the inductor L1 is constructed by winding 144 turns of #19 AWG heavy film (MW-80C) magnet wire 42 around a toroidal core 40, such as the core part number 157-26 noted above. In a preferred embodiment, the winding turns are single layer windings to yield more consistent results, although one can envision multiple layer windings. Particular lengths, such as 0.5 inch, portions of the wire 42 are stripped at first and second ends 44a, 44b thereof and a first test waveform of about 678 mV at 10 KHz is applied across the inductor L1 to ensure that the inductance of the inductor L1 is within a range of about 1.86 ml-2.28 mH at the applied frequency. Next, the two ends 44a, 44b of the wire 42 are trimmed and stripped such that each end 44a, 44b of the wire 42 extends from the toroidal core 40 about 2.5 inches. Thereafter, about 0.5 inch of each end 44a, 44b of the wire 42 is coated with tin. The first test waveform is applied across the inductor L1 again to ensure that the inductance of the inductor L1 remains within the range of about 1.86 mH-2.28 mH at the applied frequency. The construction and characteristics of the inductor L4 are similar or identical to those of the inductors L1-L3 except that 50 turns of 15AWG heavy film (MW-80C) magnetic wire (not shown) are wound around the toroidal core 40 and a second test waveform of about 235 mV at 10 KHz instead of the first test waveform is applied across the inductor L4 after the winding of the inductor L4 and again after trimming of the wire ends to ensure that the inductance thereof falls within a second range of about 0.225 mH-0.275 mH at the applied frequency.

Figure 1D:
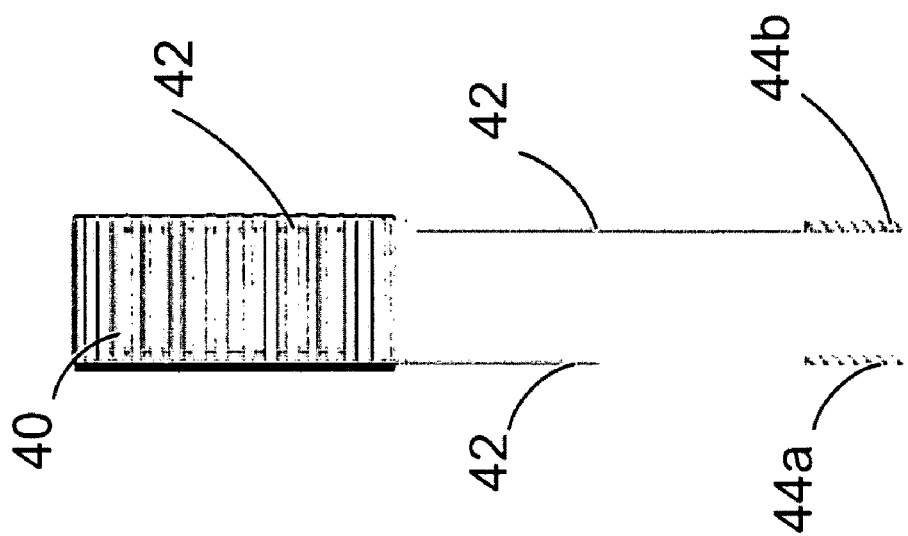
FIG. 1D shows a side elevational view of the toroidal core of FIG. 1C.
Figure 1C:
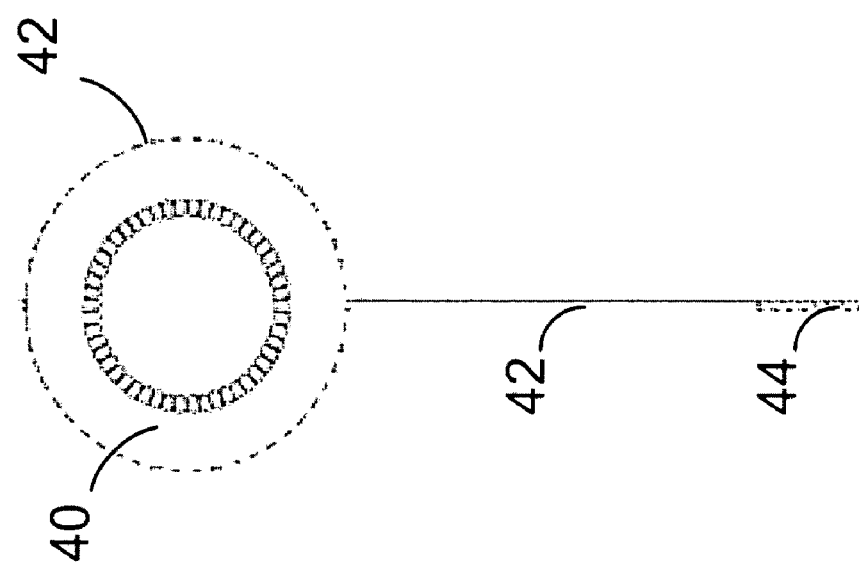
FIG. 1C shows a front elevational view of a toroidal core of an inductor that can be used in the power conditioning circuits of FIGS. 1, 1A, and 1B.
Figure 1F:
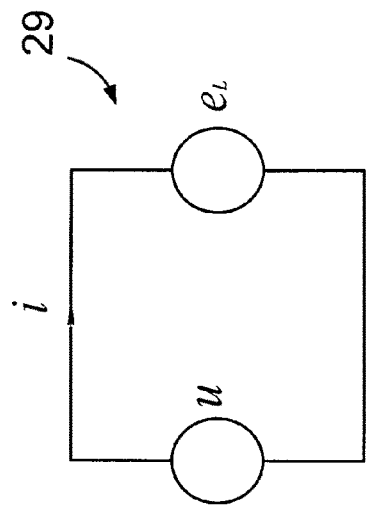
FIG. 1F illustrates an equivalent circuit of the inductors of FIG. 1C.
Figure 1E:
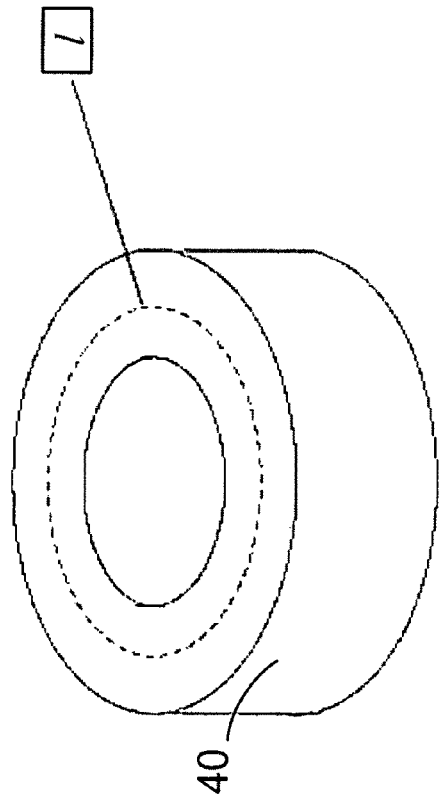
FIG. 1E depicts an isometric view of the toroidal core of the inductor of FIG. 1C.

FIG. 1E shows the toroidal core 40 of the non-linear inductor L1 with a core centerline of circumferential length l and w coil windings. The intensity H of a magnetic flux field in the toroidal core 40 is given by the expression $$H = \frac{wi}{l}, \quad (1)$$

therefore, the current i in the inductor L1 when power from the commercial power source is delivered thereto is given by the expression:

$$i = \frac{l}{w}H. \quad (2)$$

Figure 1G:
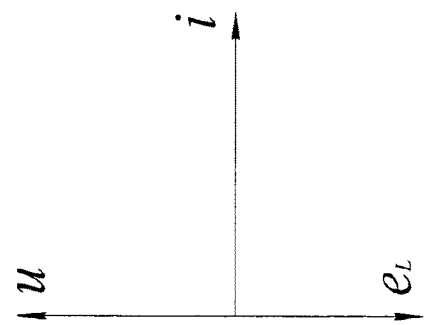
FIG. 1G is a vector diagram that illustrates the phase difference between an applied voltage and an electromotive force of self induction of the inductors of FIG. 1C.

FIG. 1F illustrates an equivalent circuit 29 of the inductor L1 (or any of the inductors L1-L4, for that matter), wherein U is a voltage applied to the inductor L1, $e_L$ is the electromotive force of self-induction of the inductor L1, and i is a current flowing through the inductor L1. FIG. 1G is a vector diagram illustrating the magnitudes and phase relationships of the applied voltage U, the electromotive force of self-induction $e_L$, and the current i through the inductor. One of ordinary skill in the art would recognize that:

$$i = F(U) \quad (3)$$

where F(U) is an as-yet undefined function of the applied voltage U to the inductor L1. One of ordinary skill in the art would also recognize that:

$$H = \phi(B) \quad (4)$$

where $\phi$ is a magnetic flux function and B is magnetic flux density. Substituting for i in equation (2):

$$i = \frac{l}{w}\varphi(B). \quad (5)$$

The average value of inductance of the inductor L1 can be computed through flux linkage $\Psi$ knowing that a cross-sectional area S of the toroidal core 40 and magnetic characteristics of the toroidal core 40 are uniform:

$$B = \frac{\psi}{wS}, \quad (6)$$

Next, substituting for B in equation (5):

$$i = \frac{l}{w}\varphi\left(\frac{\psi}{wS}\right). \quad (7)$$

Equation (7) illustrates a relationship between the current i and the flux linkage $\Psi$. Further, the electromotive force of self-induction $e_L$ of the inductor L1 can be expressed as:

$$e_L = -d\Psi/dt \quad (8)$$

From the vector diagram of FIG. 1G, one can ascertain that:

$$U = -e_L \quad (9)$$

Using equation (9) in equation (8) and solving for $\Psi$, one obtains:

$$\psi = \int_0^t U \, dt \quad (10)$$

Now substituting equation (10) into equation (7) results in a formula for the current (i) through the inductor L1 which models the response of the inductor L1 (or any of the inductors L2-L4):

$$i(t) = \frac{l}{w}\varphi\left(\frac{\int_0^t U \, dt}{wS}\right). \quad (11)$$

In a preferred polyphase embodiment, the inductance of each inductor L1-L4 at a particular applied RMS voltage level and at a fundamental frequency (e.g., 120 volts at 60 hz.) is selected to be equal to a first desired value as noted in greater detail hereinafter, the inductance at 100 KHz>=1.0 mH, the inductance at 300 KHz>=2.0 mH, the inductance at 1 MHz>=5.0 mH, the inductance at 500 MHz>=8.0 mH, the inductance at 1 GHz>=4.0 mH, and the inductance at 2 GHz>=3.0 mH. In a first preferred embodiment of a 20 amp rated power conditioning circuit, each of the inductors L1-L3 has a minimum Oe rating of about 98.03 Oe, and L4 has a minimum Oe rating of about 62 Oe. In another preferred embodiment of a 10 amp rated power conditioning circuit, each of the inductors L1-L3 has a minimum Oe rating of 112.03 Oe, and the inductor L4 has a minimum Oe rating of 57.38 Oe. In yet another preferred embodiment of a 5.0 amp rated power conditioning circuit, each of the inductors L1-L3 has a minimum Oe rating of about 56.1 Oe and the inductor L4 has a minimum Oe rating of about 28.69 Oe. Furthermore, in still another preferred embodiment of a 2.5 amp rated power conditioning circuit, each of the inductors L1-L3 has a minimum Oe rating of about 63.3 Oe and the inductor L4 has a minimum Oe rating of about 21.98 Oe. In a single phase example, a 10 amp power conditioning circuit may include the inductors L1 and L2 each having inductances of 2.5 mH at the fundamental frequency and an Oe value of 90 while the inductor L3 has a rating of 1 mH at the fundamental frequency and an Oe value of 85. In each embodiment, the high Oe rating values of the inductors L1-L3 (and L4 in polyphase embodiments) allow the power conditioning circuit 20 to support a magnetic field under a maximum rated RMS AC current and still have headroom to support an instantaneous field for transient or noise capture. It should further be noted that, in one or more of the above embodiments, one or more inductors having Oe ratings lower than the values specified may alternatively be used, although such substitution may result in a reduction in transient attenuation capability. In general, the use of non-linear inductive elements is contemplated each having a minimum Oe rating sufficient to obtain the desired transient suppression capability.

In addition to the high Oe values of the inductors L1-L4, the nominal inductance values of the inductors L1-L4 are selected to enable the power conditioning circuit 20 to effectively prevent unwanted frequency components of power from reaching the load 38. Each of the inductors L1-L4 has an increasing inductance value relative to frequency and the inductance selected for each of the inductors L1-L4 is preferably approximately the minimum inductance required at the nominal frequency of the power source.

The power conditioning circuit 20 maintains a magnetic field that captures and normalizes transient current flows on a circuit, for example current flowing through the first conductor 22. As one magnetic flux field in one of the inductors L1-L4 is collapsing in sync with an AC sine wave supplied to the inductors L1-L4, another magnetic flux field is formed on one of the other inductors L1-L4. For example, in a single-phase implementation, at some point in time a full magnetic field due to current flowing in the first conductor 22 is present when the neutral conductor 26 does not generate a magnetic field or a full field may be due to current flow through the neutral conductor 26 and none on the first conductor 22, and so on. In a polyphase circuit, when a magnetic field due to current of the first conductor 22 is at full strength, another magnetic field due to current on the second conductor 24 may be at zero, and other magnetic fields due to the neutral and ground conductors 26, 28 may be between 40% and 60% strength. The presence of transient currents or other power disturbances will cause a transient magnetic field to form and collapse at any point. The transient magnetic field would be of a different vector from the magnetic fields that arise due to power at the nominal frequency. For example, when a transient voltage surge (TVS) occurs, the transient magnetic field due to the transient current voltage or other power disturbance would interfere with the magnetic fields due to power at the nominal frequency and cause saturation of the standard inductors in a conventional circuit or at least adversely limit the strength of the magnetic fields of such inductors. The speed and magnitude of the TVS is such that it can overwhelm an active magnetic field, if even for a brief moment, resulting in undesired current flow towards and through a protected load. The presence of voltage limiting components, such as an MOV, across voltage paths in the power conditioning circuit 20 prevents saturation of magnetic fields due to power at the nominal frequency. The MOVs cause an instantaneous change in voltage in an opposite direction of the power disturbance. The voltage change creates a large, dense magnetic field that impedes some components of the undesirable energy, captures some components of the undesirable energy, and dissipates a remainder of the undesirable energy.

Inductors having a high Oe rating provide increasing attenuation with increasing transient frequency resulting in very substantial attenuation for transients. For example, a 10 microsecond transient of 500V with a rise time of 5 microseconds has a substantial frequency component of 50 KHz. Since inductors that have high Oe ratings do not reach saturation under this condition, the 50 KHz transient pulse will be attenuated based on a standard inductance reactance formula, $X(L)=2*pi*f*L$, which for L1, L2, and L3 each having an inductance value of 2.0 mH will be: 6.28*50,000*2.0E-3=628 ohms.

The non-saturating aspect of the design of the inductors L1, L2, and L3 provides ample margin between the saturation point of a marginally designed inductor (one for which saturation is just avoided at full voltage) and the actual saturation point, such margin being a factor of at least 3 to 4 times that of the marginally designed inductor. This margin gives the MOVs ample time to clamp the transient voltage, so the magnetic field, driven by the current from $E=L*(dI/dt)$ never exceeds the Oe rating. Therefore, the inductors L1, L2, L3, and L4 are always active as current limiters in the power conditioning circuit 20, and thus a major contributor to effective power conditioning.

In tests specified by Underwriter's Laboratories for ANSI/UL-1449, 3 rd Edition, a 6,000 volt transient at 5,000 Amperes is imposed on the first and second conductors 22, 24 at a 90 degree point in an input sine wave. For 240V AC power, as used in the United States, the first conductor 22 is a sine wave, V=sine(wt). The second conductor 24 is also a sine wave, but is 180 degrees out of phase with the first conductor 22. Therefore, V(second conductor)=sine((w+180)t), so when a balanced 6,000 volts is applied, the 3,000 volts on first conductor 22 is at the peak of its voltage, and the 3,000 volts on second conductor 24 is at the minimum of its voltage. Under this voltage condition, marginally designed inductors in a conventional power conditioning circuit would enter saturation almost immediately after the imposition of the 6 KV 5 KA waveform, regardless of the presence of MOV in the conventional power conditioning circuit because the MOV response is not instantaneous.

It is believed that a combination of MOVs and inductors having high Oe ratings in the power conditioning circuit 20 prevents transients from damaging sensitive load equipment because such inductors can sustain high magnetic flux values without saturating. Therefore, the power conditioning circuit 20 utilizing the inductors L1-L4 that have a high Oe rating would provide better protection for loads that may be connected thereto. With a large tolerance for a differential between the voltages on the first, second, neutral, and ground conductors 22, 24, 26, 28 due to the high Oe rating of the inductors L1-L4, the MOVs have time to suppress the rising voltage because the high Oe inductors do not saturate. Therefore, such inductors are always functional in the power conditioning circuit 20. Specifically, the MOVs operate to maintain the magnetic field in the inductors L1-L4 so that the inductors L1-L4 can function as a barrier to prevent transient voltages and currents from reaching the load 38.

The inductors L1, L2, L3, and L4 are able to function as a barrier to transients because of their reactive impedance, which is large enough to dissipate the high-frequency transient components such as high slew rates on voltage and high harmonics. For example, a voltage slew rate corresponding (from Fourier analysis) to 1 MHz, $X(L)=2*3.14159*1E6*2.0$ mH=12.566 MegOhms. In contrast, at a lower frequency voltage slew rate of 300 Hz (using United States frequency standards), the impedance is $X(L)=2*3.14159*300*2.0$ mH=3.77 ohms. In comparison, the impedance X(L) at 60 Hz is a negligible 0.21 ohm. At the higher frequencies, the increased impedance also causes a phase shift that is negligible at such frequencies and tends to bring the phase of the high-frequency waveform back toward the phase of the fundamental frequency.

Figure 2:
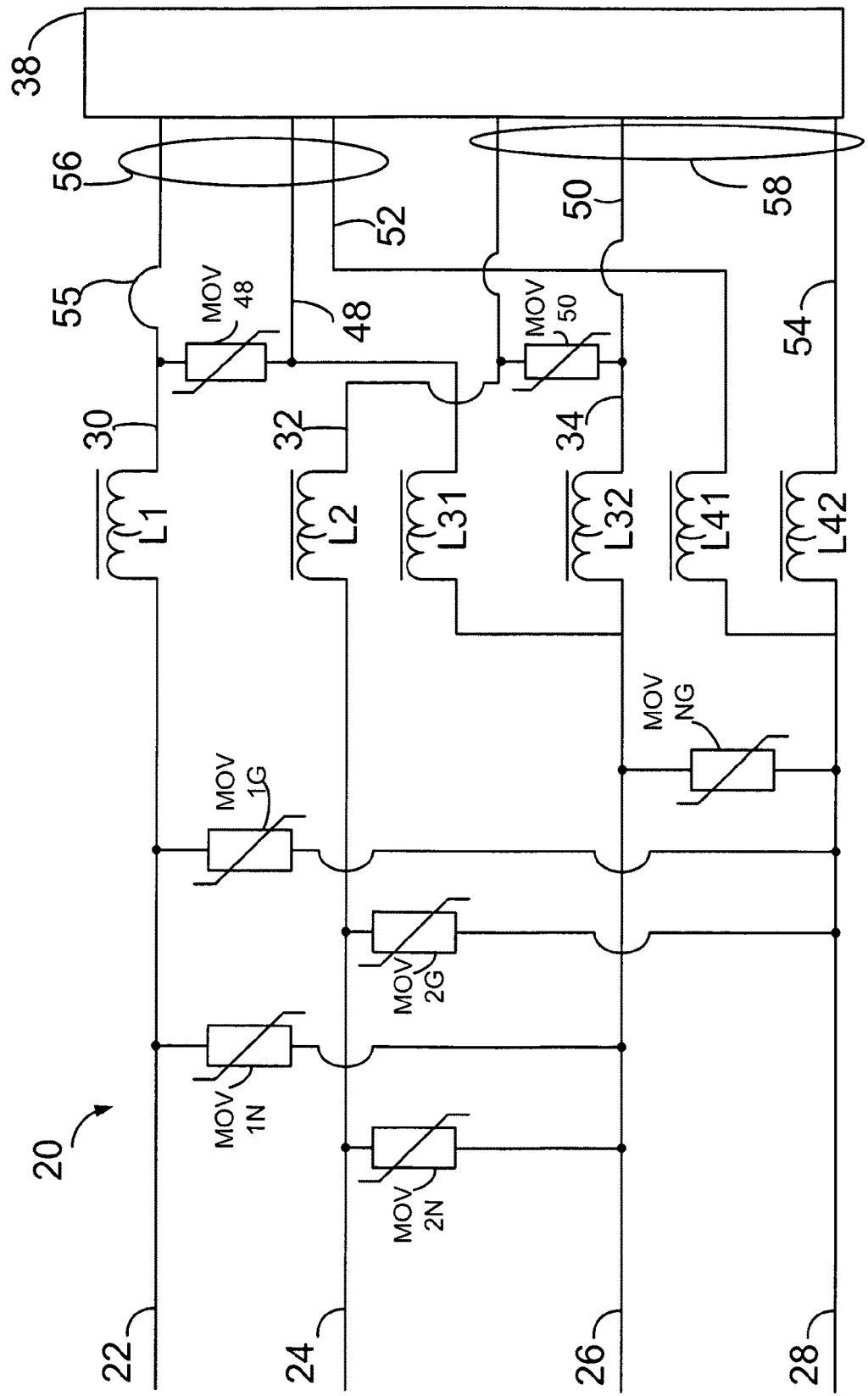
FIG. 2 is a schematic diagram of yet another embodiment of the power conditioning circuit of FIG. 1.

FIGS. 1A, 1B, and 2 illustrate other embodiments of the power conditioning circuit 20, wherein elements common to the FIGS. are assigned like reference numerals. Referring first to FIG. 1A, a delta implementation of the power conditioning circuit 20 is shown. The neutral conductor 26, the MOV1N, MOV2N, MOVNG, and the inductor L3 are omitted from the delta implementation. With reference to FIG. 1B, yet another embodiment of the power conditioning circuit 20 is shown. In this embodiment, a capacitor C1 is coupled between the first and second conductors 22, 24 to perform power factor correction at a point between the inductors L1, L2 and the load 38. In each embodiment, the inductors L1, L2, and L4 (in the embodiment of FIG. 1A) and the inductors L1-L4 (in the embodiment of FIG. 1B) and have high Oe values as in the embodiment of FIG. 1.

FIG. 2 illustrates a split phase voltage implementation of a different embodiment of the power conditioning circuit 20. In this embodiment, inductors L31 and L32 are connected in parallel between the neutral conductor 26 and the load 38 by output lines 48 and 50. Similarly, inductors L41 and L42 are coupled in parallel between the ground conductor 28 and the load 38 by output lines 52 and 54. A circuit breaker 55 is coupled in series with the inductor L1 and the load 38. An MOV48 is coupled across the output line 30 and the output line 40 to create a first branch circuit 56. In addition, an MOV50 is coupled across the output lines 32 and 42 to create another branch circuit 58. Again, the inductors have high L1, L2, L31, L32, L41, and L42 have high Oe values. Therefore, a load 38 that is connected to the branch circuit 56 is effectively isolated from noise reflections that may be due to another load 38 that is connected to the branch circuit 58.

Figure 3:
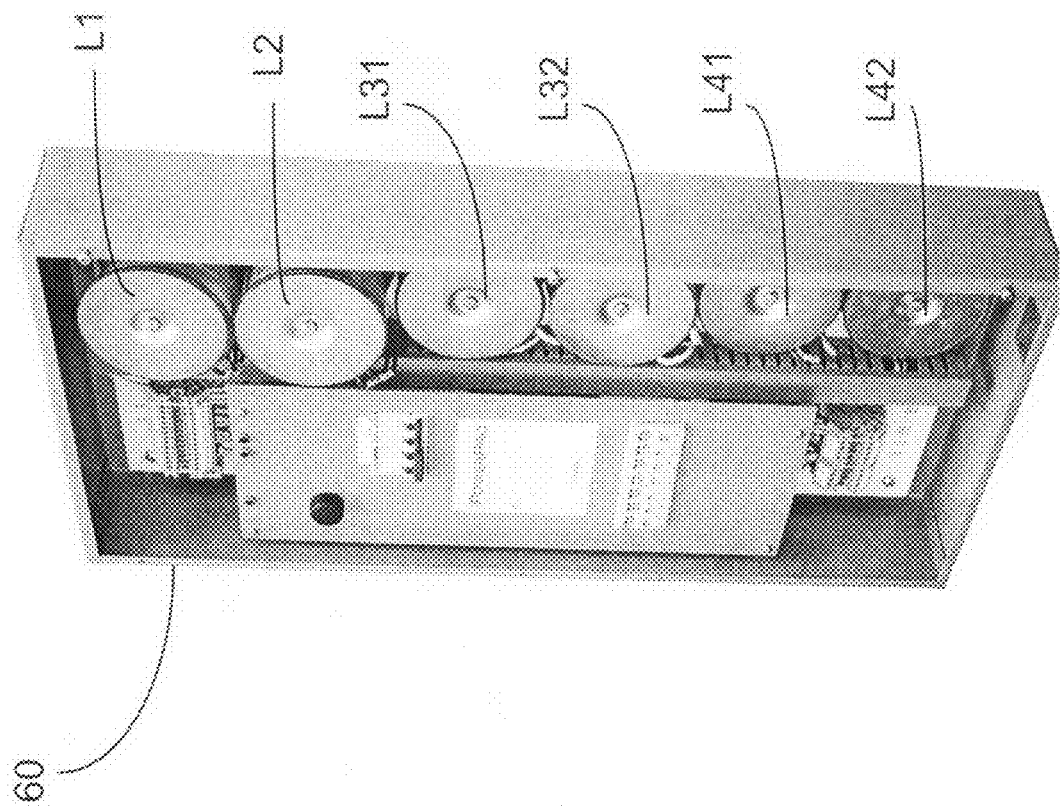
FIG. 3 is an illustration of an implementation of a standard electric utility power panel incorporating the power conditioning circuit of FIG. 2 with a cover of the panel removed to show the general organization of the power conditioning circuit.

FIG. 3 is an illustration of an implementation of the schematic of FIG. 2 in a configuration suitable for use with a standard electric utility power panel 60 such as is found in residential and small commercial installations. A cover of the panel 60 has been removed to show the general organization of the components inside the panel 60. The six inductors in the panel 60 correspond to the six inductors L1, L2, L31, L32, L41, and L42 shown in FIG. 2. The large size of the inductors L1, L2, L31, L32, L41, and L42 is due to the high Oe rating to avoid saturation at a minimum of 3-4 times the full rated current for a pure sinusoidal supply at the nominal frequency.

Figure 4:
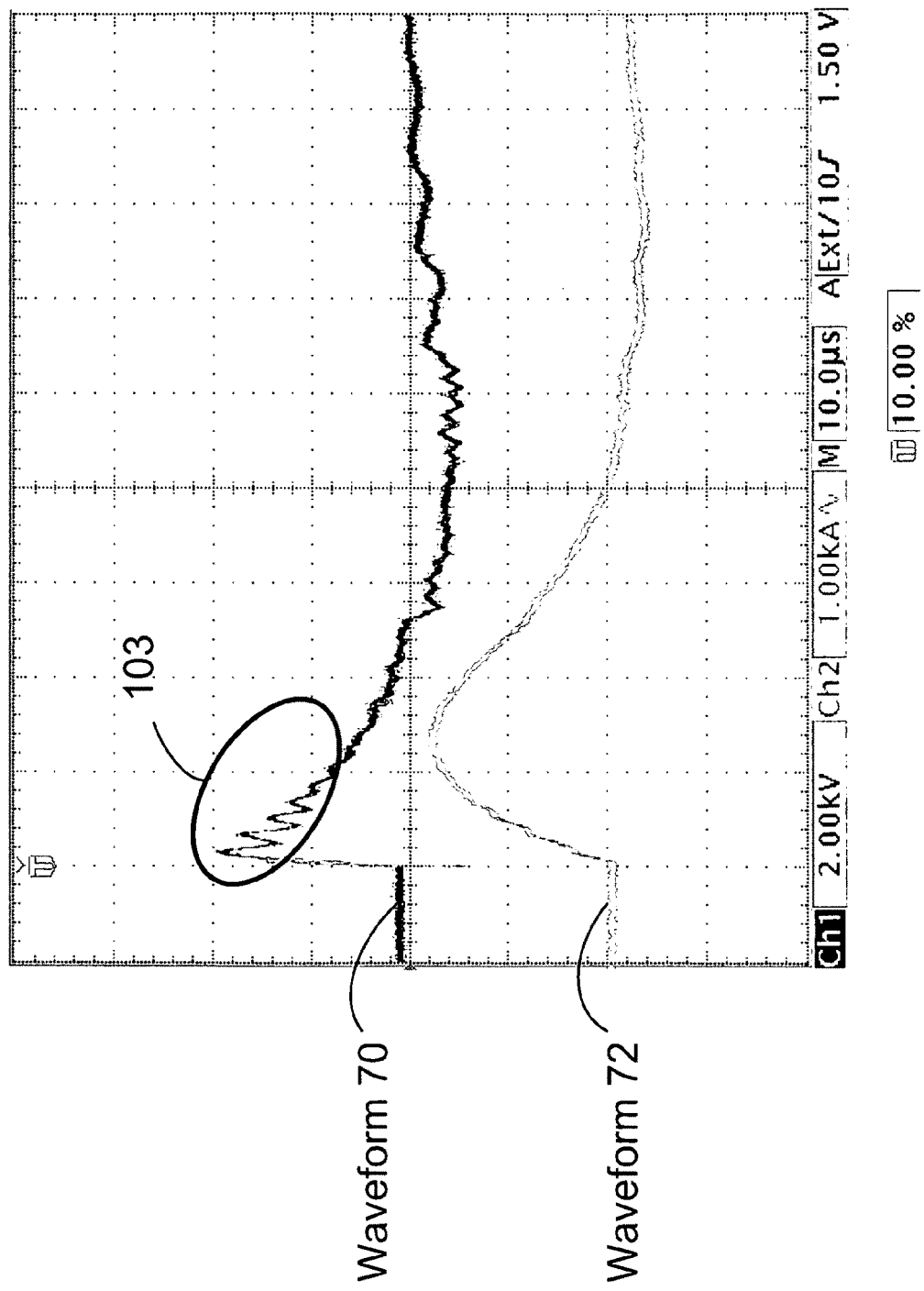
FIG. 4 is a screen shot of an oscilloscope displaying waveforms of current and voltage due to a simulated power disturbance from a power source.

FIG. 4 depicts a screen shot of an oscilloscope measurement of a surge waveform 70 that was recorded when an oscilloscope was connected to an International Electric Consortium (IEC) 1000-4 class 4 combination wave 6 KV, 3 KA 1.2/50 microsecond L1/high to L2/low waveform generated by a power source comprising an advanced EMC PRO immunity test system manufactured by Thermo Voltek of Lowell, Mass. The waveform 70 was inserted at a 90 degree point of a sinusoidal fundamental frequency (maximum positive potential). The waveform 70 represents a line1-line2 voltage measured across the first and second conductors 22, 24 and waveform 72 represents a line current measured on the first conductor 22. Detailed specifications of the 1.2/50 microsecond test characteristics are available in the ANSI/UL-1449 3 rd edition, Appendix B.

Figure 5:
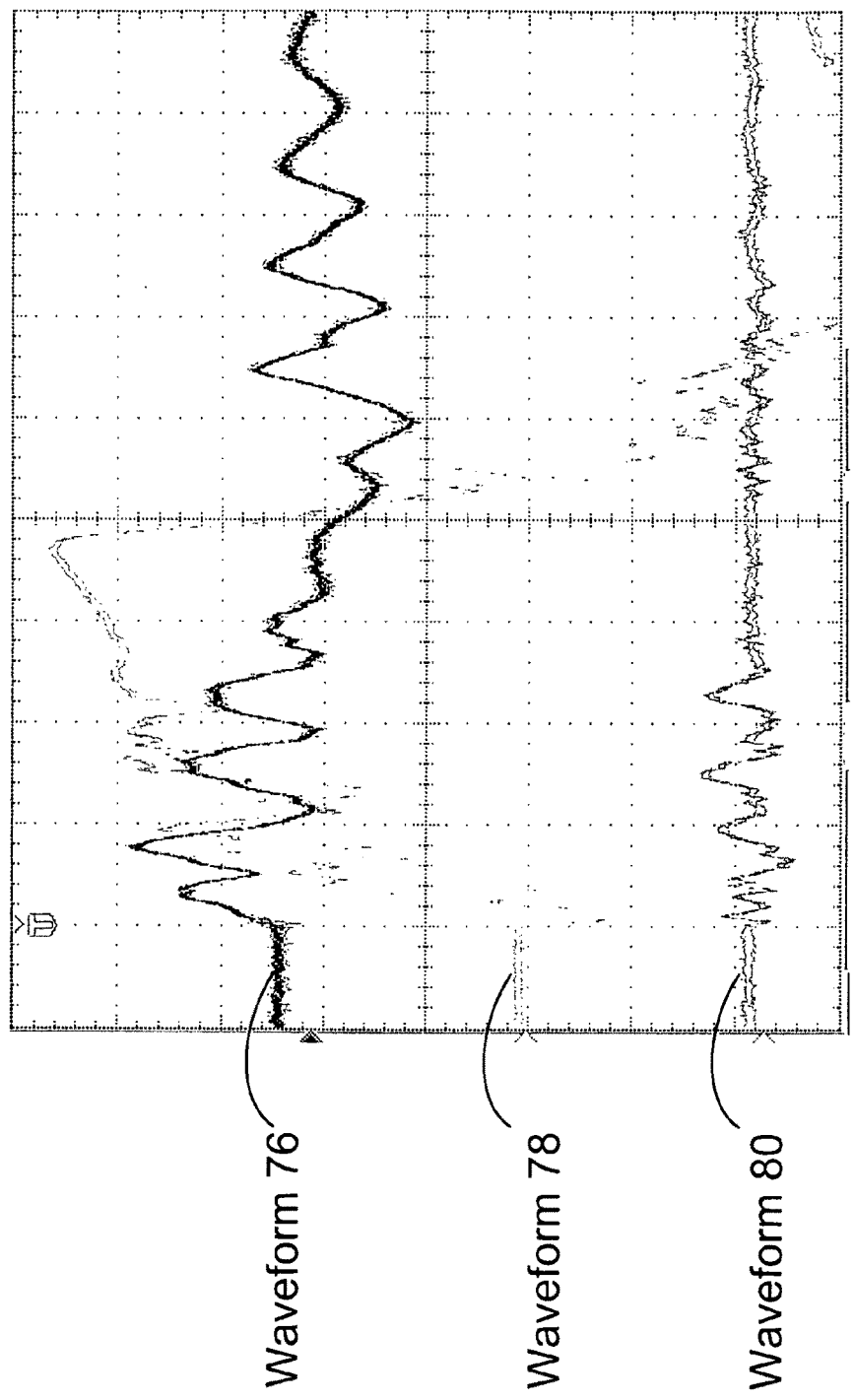
FIG. 5 is a screen shot of an oscilloscope displaying waveforms of current and voltage downstream of a prior art transient voltage surge suppressor (TVSS)

FIG. 5 shows an actual oscilloscope measurement of an output of a prior art transient voltage surge suppressor (TVSS) (not shown), illustrating an energy "let-through" at an end of a branch circuit downstream of the prior art TVSS that was connected to the power source of FIG. 4. A waveform 76 shows a measurement of the voltage across first and second output conductors 30, 32 and waveform 78 shows a reading of a current on the first output conductor 30. A waveform 80 illustrates a reading of a current on a ground conductor. All the measurements were taken at a point between the prior art TVSS and a load. The energy measured at an input of the prior art TVSS was calculated to be 1,187 Joules and the energy output at an output of the prior art TVSS was calculated to be 118 Joules. Further, a current of 20 Amperes peak-to-peak was measured on a ground conductor at an output of the prior art TVSS.

Figure 6:
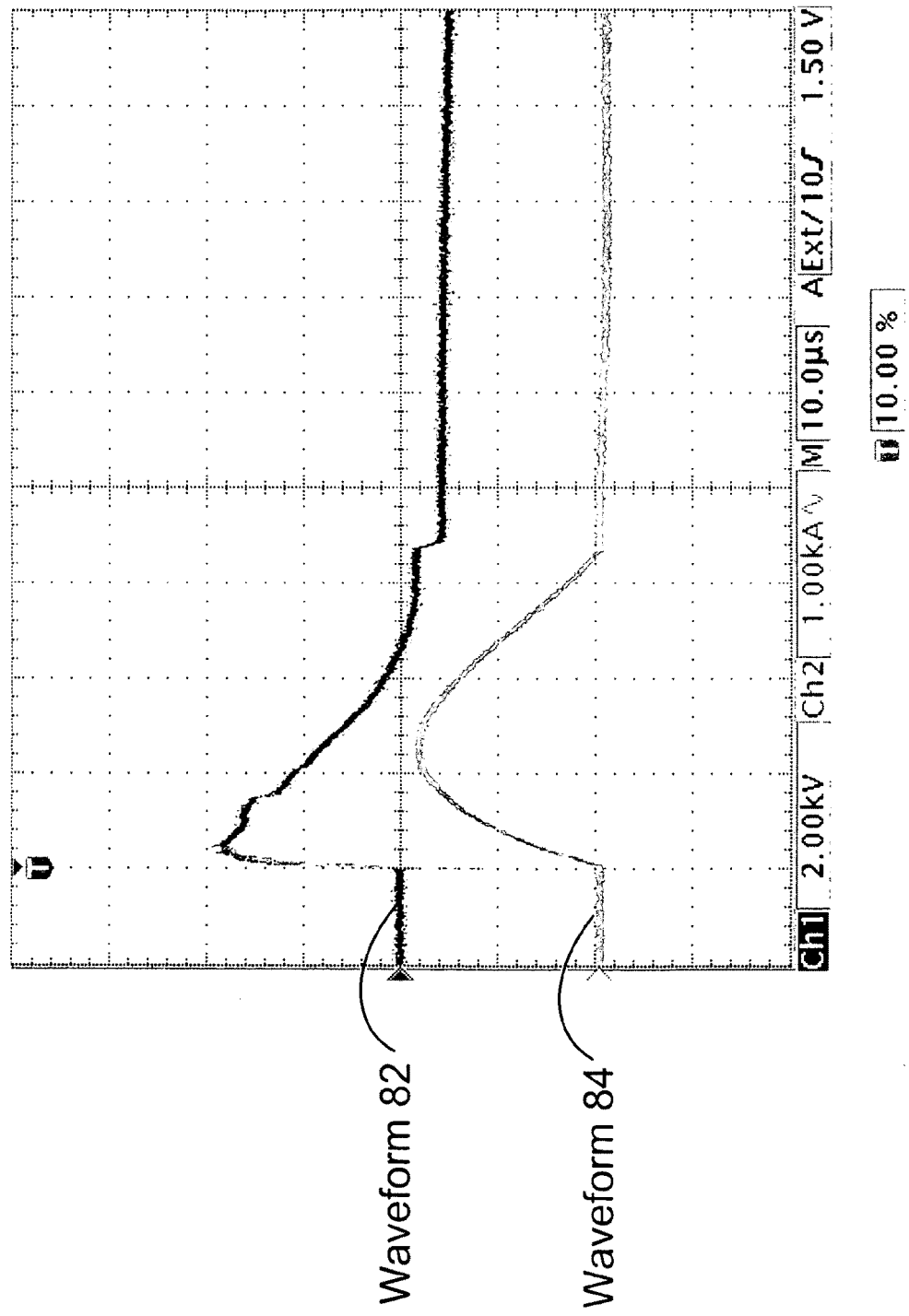
FIG. 6 is a screen shot of another oscilloscope displaying waveforms of current and voltage at the power source of FIG. 4.

Turning now to FIG. 6, a screen shot of an oscilloscope measuring a 1.2/50 microsecond pulse at 6 KV, 3 KA from L1/high to L2/low waveform that was generated by the EMC immunity test system shows actual values of voltage measured across the first and second conductors 22, 24 and a current flowing through the first conductor 22 of the power conditioning circuit 20. The inductance value of each of L1 and L2 was 2.5 mH while the inductance value of each of L31 and L32 was 1.0 mH. The inductance value of each of L41 and L42 was 0.25 mH. These inductance values were selected to prevent saturation through a minimum of four times the rated current so as to provide effective protection to the load 38 that may be connected to the power conditioning circuit 20. All of the metal oxide varistors employed in this embodiment are Ferraz-Shawmut model ST1201PG or other appropriate part numbers that support the required Maximum Continuous Operating Voltage (MCOV), with the following ratings—AC: MCOV 150 to 550, 100 KA Interrupting Rating, 50 KA 8/20 microsecond surge capacity (per mode), 100 kA 8/20 microsecond surge capacity (per phase).

Figure 7:
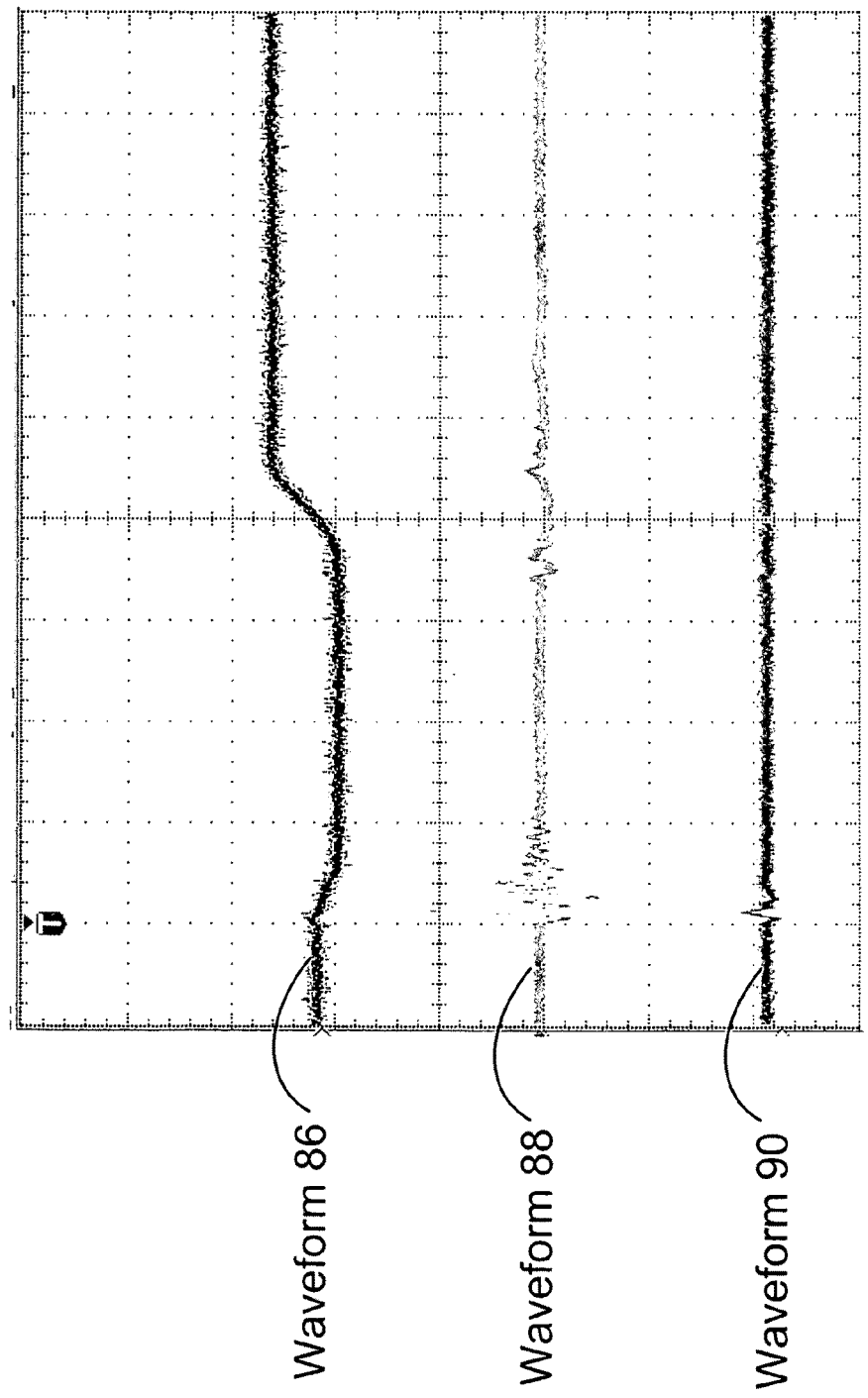
FIG. 7 is a screen shot of an oscilloscope displaying waveforms measured at an end of a branch circuit of the schematic diagram of FIG. 2 when the schematic diagram of FIG. 2 is connected to the power source of FIG. 4.

FIG. 7 illustrates oscilloscope measurements at an end of a branch circuit 45 (FIG. 2) of the power conditioning circuit 20 of FIG. 2, using the component values listed for FIG. 6, wherein the EMC PRO immunity test system was used to simulate a lightning strike having 1,178 Joules of energy to the power conditioning circuit 20. Measurements taken at the end of the branch circuit 45 of the power conditioning circuit 20 indicated that only 8 Joules was delivered to the load 38 (as opposed to 118 Joules in the prior art product of FIG. 5).

Figure 8:
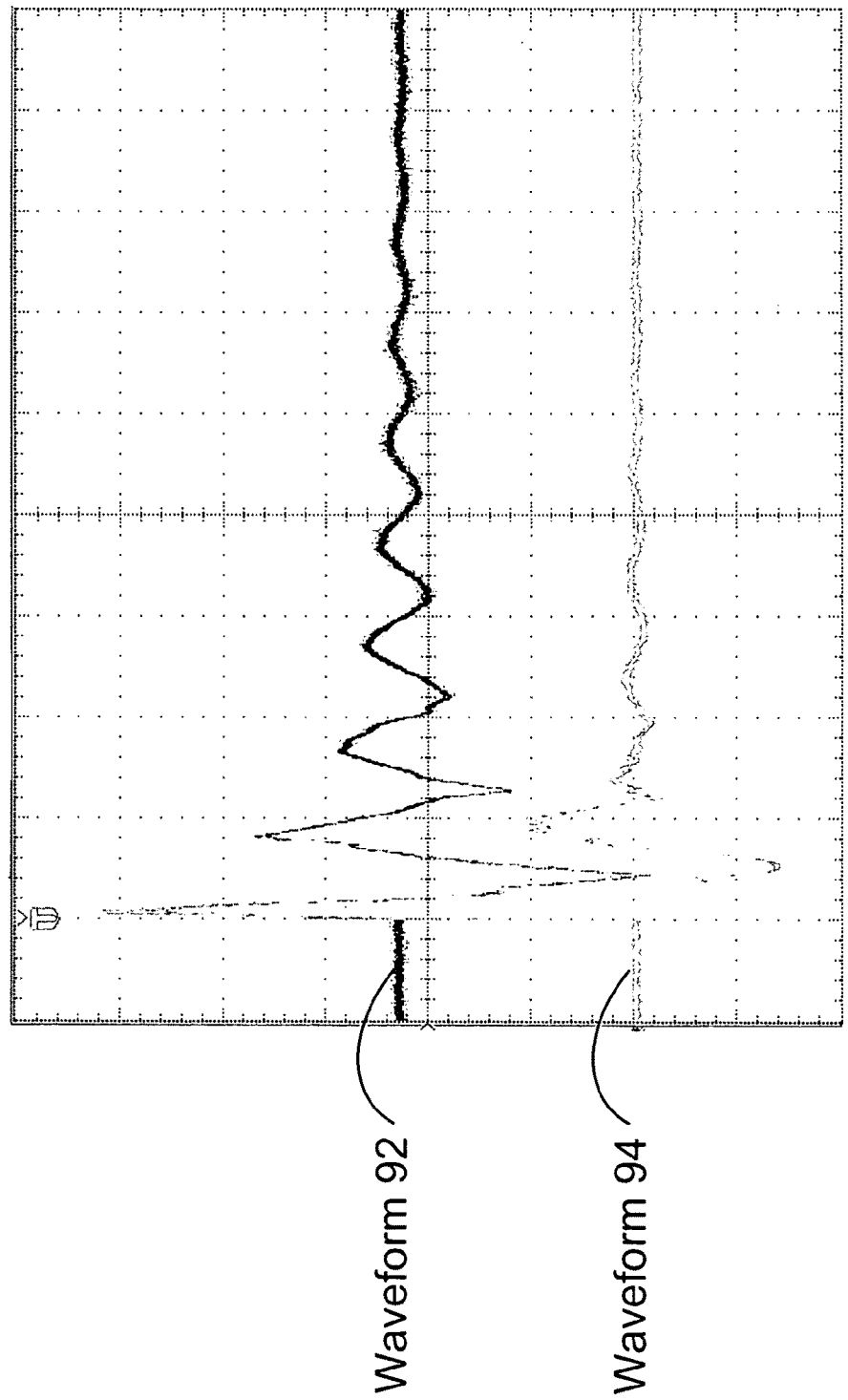
FIG. 8 is a screen shot of an oscilloscope displaying waveforms of a simulated 6 KV, 500 A ring-wave.

FIG. 8 depicts a ring wave surge of 8/20 6,000 volts, 500 Amperes from the first conductor 22 (high) to the second conductor 24 (low), at a 90 degree point on a sine wave (peak voltage) having 254 Joules of energy that was generated by the EMC immunity test system. A waveform 92 shows a measurement of the voltage across the first and second conductors 22, 24 and a waveform 94 shows a measurement of the current flowing through the first conductor 22.

Figure 9:
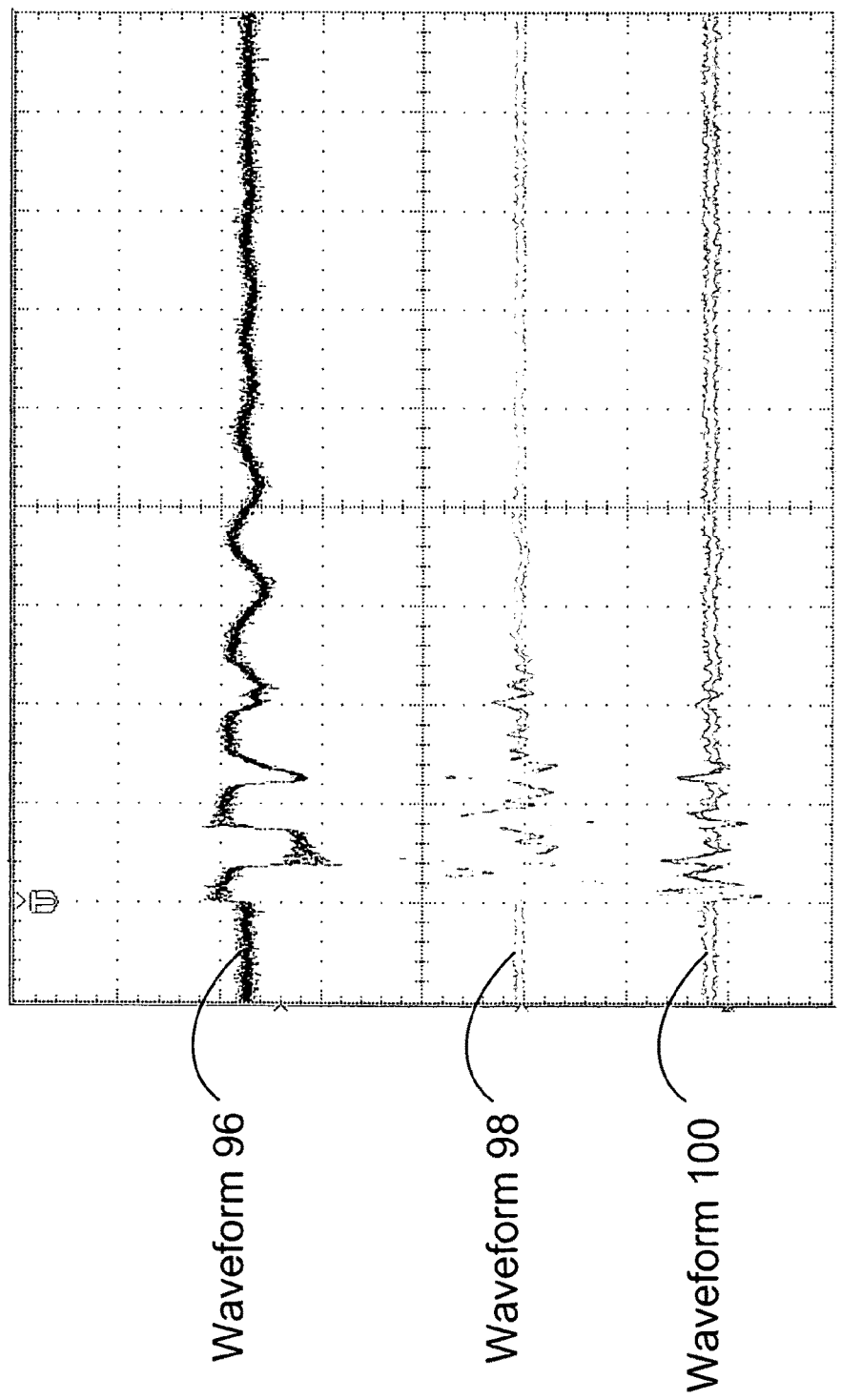
FIG. 9 is a screen shot of an oscilloscope displaying waveforms from outputs of a prior art TVSS when the ring-wave of FIG. 8 was applied to the prior art TVSS.

FIG. 9 depicts oscilloscope measurements taken at a load center panel (not shown) that is connected in parallel to the first, second, neutral, and ground conductors 22, 24, 26, and 28 of the power conditioning circuit of FIG. 2 when the ring-wave of FIG. 8 is applied to the power conditioning circuit 20. A waveform 96 shows a measurement of the voltage across the first and second conductors 22, 24, and a waveform 98 shows a measurement of the first conductor 22 current. A waveform 100 depicts a measurement of the ground conductor 28 current. It is pertinent to note that the ring-wave energy was calculated to be 254 Joules and the energy delivered to the branch circuit 45 was calculated to be 18 Joules. The waveforms 98 and 100 depict the clamping performance of the power conditioning circuit 20 with no load attached to the power conditioning circuit 20. The waveforms 98 and 100 indicate the ability of the power conditioning circuit 20 to suppress ring-wave surges and effectively prevent the large ring-wave surge from posing a hazard to a fully open load center, i.e., a load center with no actual loads (or very few loads) attached. This suppression prevents arcing through the air at receptacles, terminal blocks, etc. when the only load present is air.

Figure 10:
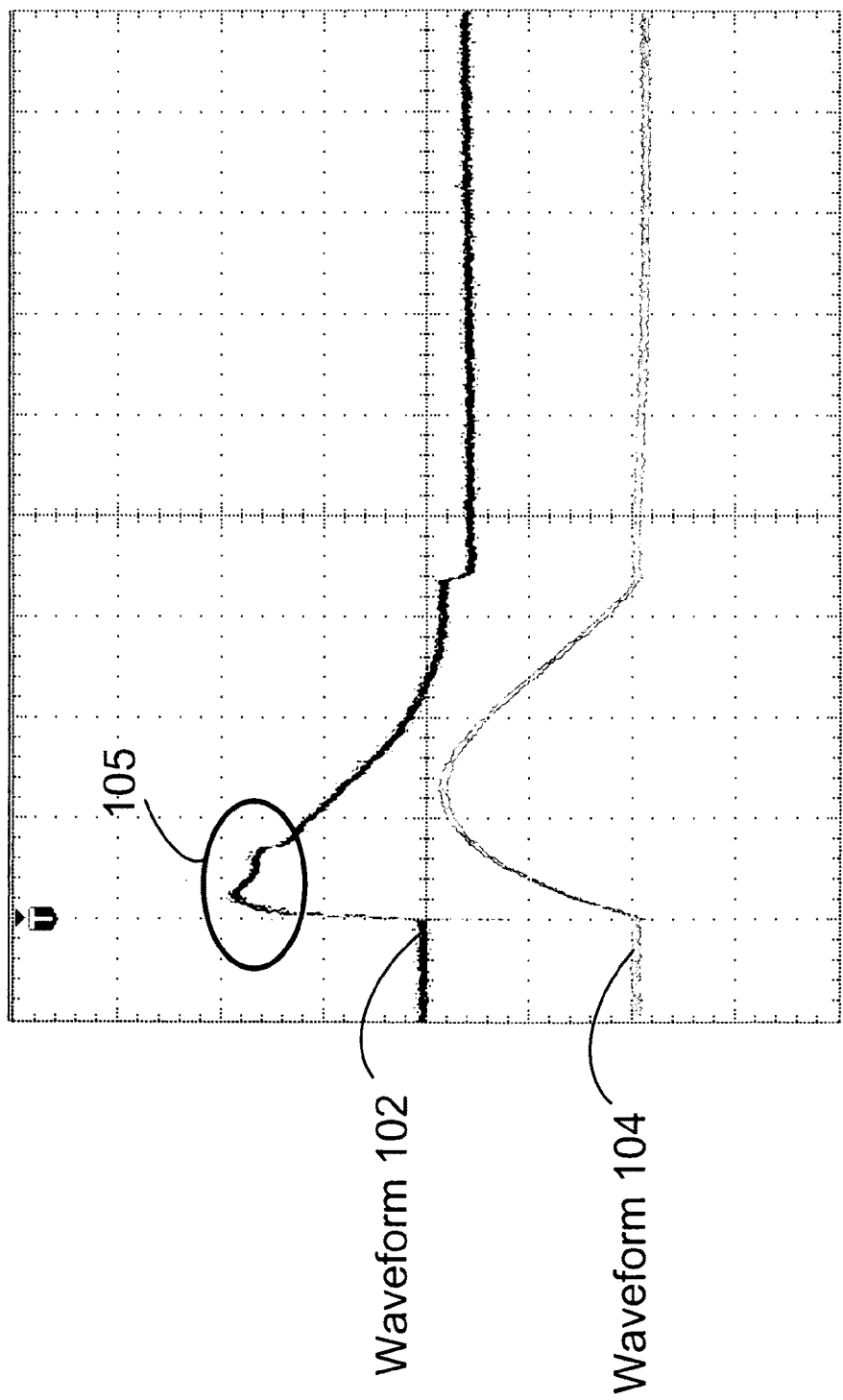
FIG. 10 is a screen shot of an oscilloscope displaying waveforms measured at the end of the branch circuit of the schematic diagram of FIG. 2 when the ring-wave of FIG. 8 was applied to the power conditioning circuit of FIG. 2.

FIG. 10 shows an oscilloscope measurement of a simulated surge waveform similar to that of FIG. 4 except that the surge waveform in FIG. 10 was applied to the power conditioning circuit 20 of FIG. 2. The energy of the surge waveform was calculated to be 1,155 Joules. A waveform 102 depicts a measurement of the voltage across the first and second 2 conductors 22, 24 and a waveform 104 shows a measurement of line current on the first conductor 22. It should be noted that the waveform 102 differs from the waveform 70 of FIG. 4 in the sense that waveform 70 includes noise that is indicated at a portion 103 while the waveform 102 is cleaner as indicated at a portion 105. This difference is believed to be due to the presence of the inductors L1-L4 in the power conditioning circuit 20.

Figure 11:
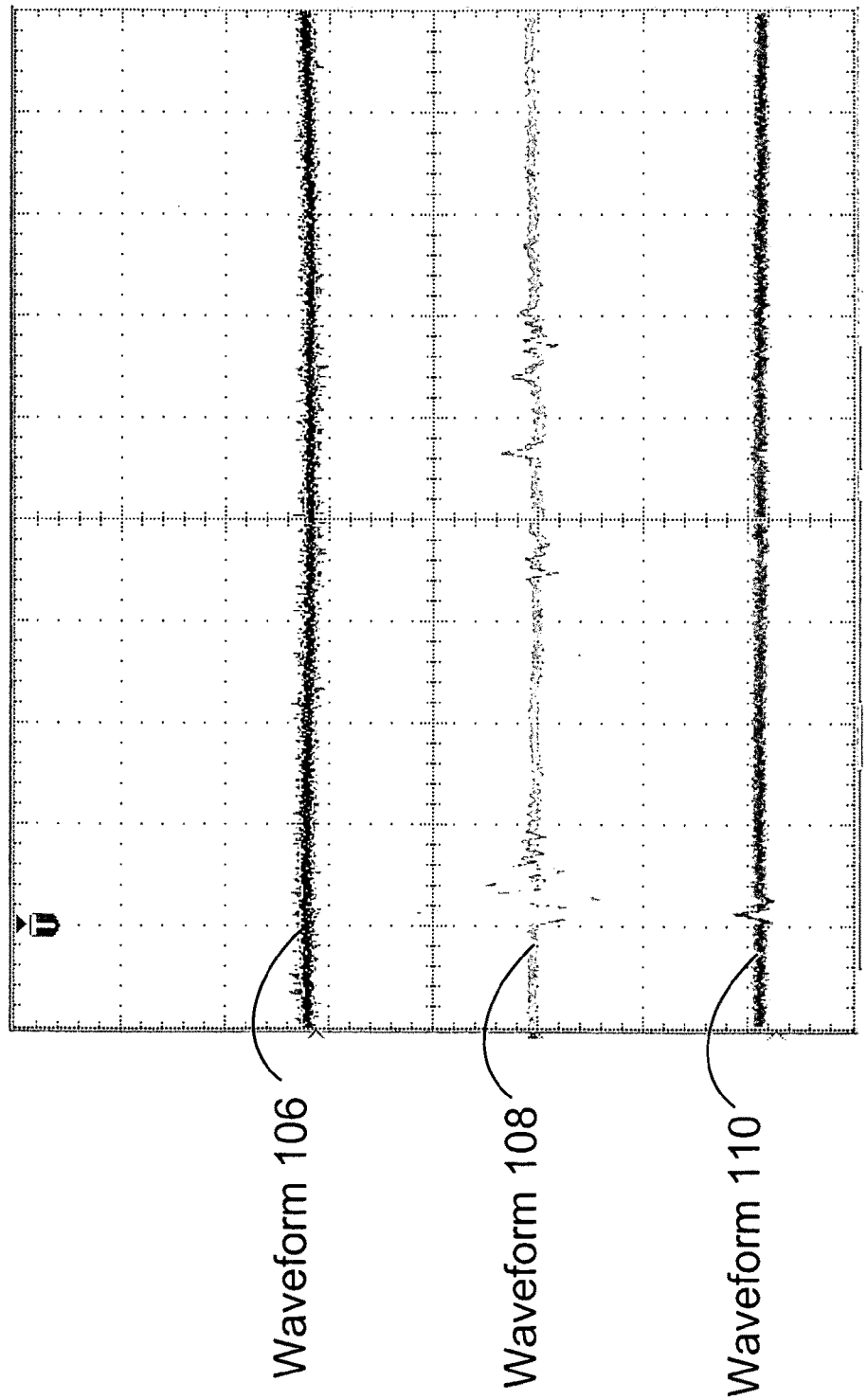
FIG. 11 is a screen shot of an oscilloscope displaying waveforms measured at an end of a parallel branch circuit in a distribution system when the ring-wave of FIG. 8 was applied to the distribution system.

FIG. 11 illustrates an oscilloscope measurement from probes at an end of the branch circuit 45 when a simulated surge waveform was applied to the power conditioning circuit 20. The branch circuit 45 included a 3 Ampere, 60 Watt light bulb load (not shown). A waveform 106 depicts a measurement of the voltage across the first and second conductors 22, 24 and a waveform 108 shows a measurement of the current flowing through the first conductor 22. A waveform 110 shows a measurement of current on the ground conductor 28. The output energy of the power conditioning circuit 20 was calculated to be 3 Joules.

Figure 12:
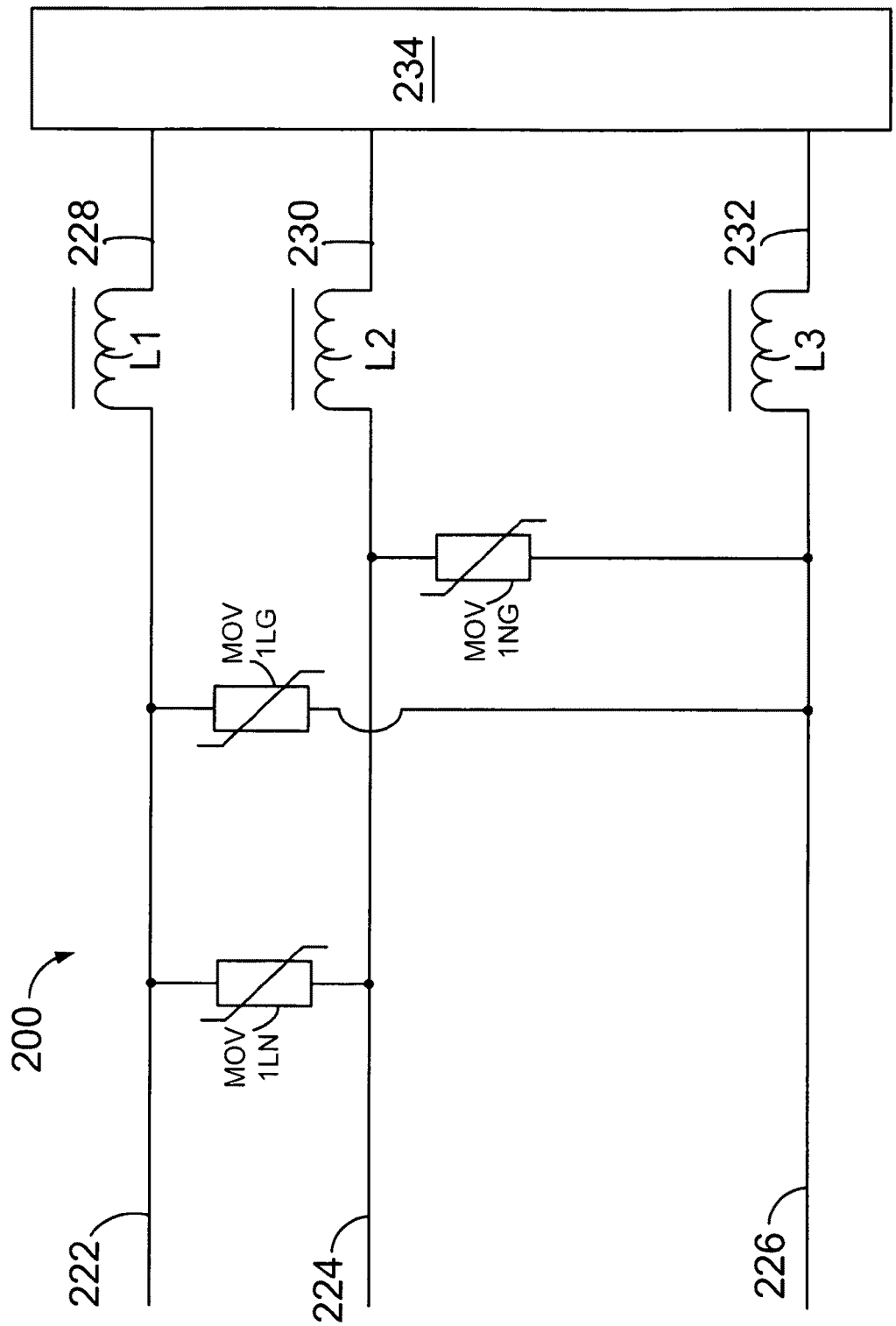

Referring to FIG. 12, a power conditioning circuit 200 is connected between first line, second line, and ground conductors 222, 224, and 266 and output lines 228, 230, and 232. The power conditioning circuit 200 may be used for branch circuits derived from a standard 240V AC split-phase power system. Power is supplied to the first, second, and ground conductors 222, 224, and 226 by any suitable power source, for example a standard electric utility. The first line conductor 222 may be connected through a circuit breaker (not shown) upstream of the circuit 200. The output lines 228, 230, and 232 may be connected to one or more loads 234. The power conditioning circuit 200 further includes first, second and third inductors L1, L2, and L3 connected in series between the first line, second line, and ground conductors 222, 224, and 226 and the output lines 228, 230, and 232. In addition, MOV1LN is coupled across the first line and second line conductors 222, 224, while MOV1LG is coupled across the first line and ground conductors 222, 226. Further, MOV1NG is coupled across the second line and ground conductors, 224, 226. This embodiment of the power conditioning circuit 200 is particularly suitable for protecting high voltage appliances such as electric ovens, air conditioners, refrigerators, etc.

Figure 13:
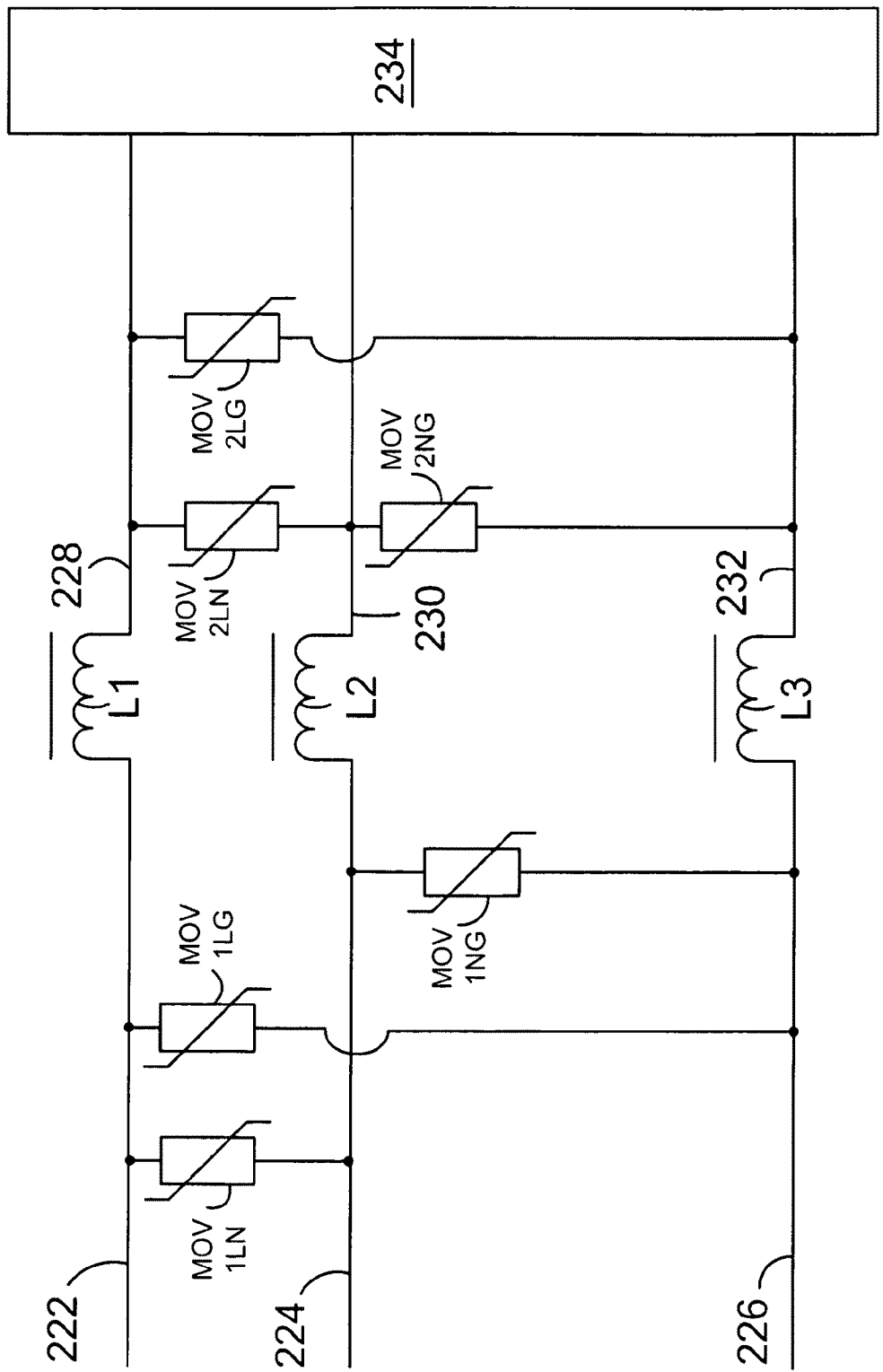
FIGS. 13-18 are schematic diagrams of other alternative embodiments of the power conditioning circuit of FIG. 12

FIG. 13 is a schematic diagram of another embodiment of the power conditioning circuit 200 of FIG. 12 employing a two-stage power conditioning circuit to a line, neutral, and ground power source. An additional stage of power conditioning is provided downstream of the inductors L1, L2, and L3 by the addition of MOV2LN, MOV2LG, MOV2NG that are coupled across the output lines 228, 230, 228, 232, and 230, 232, respectively.

Figure 14:
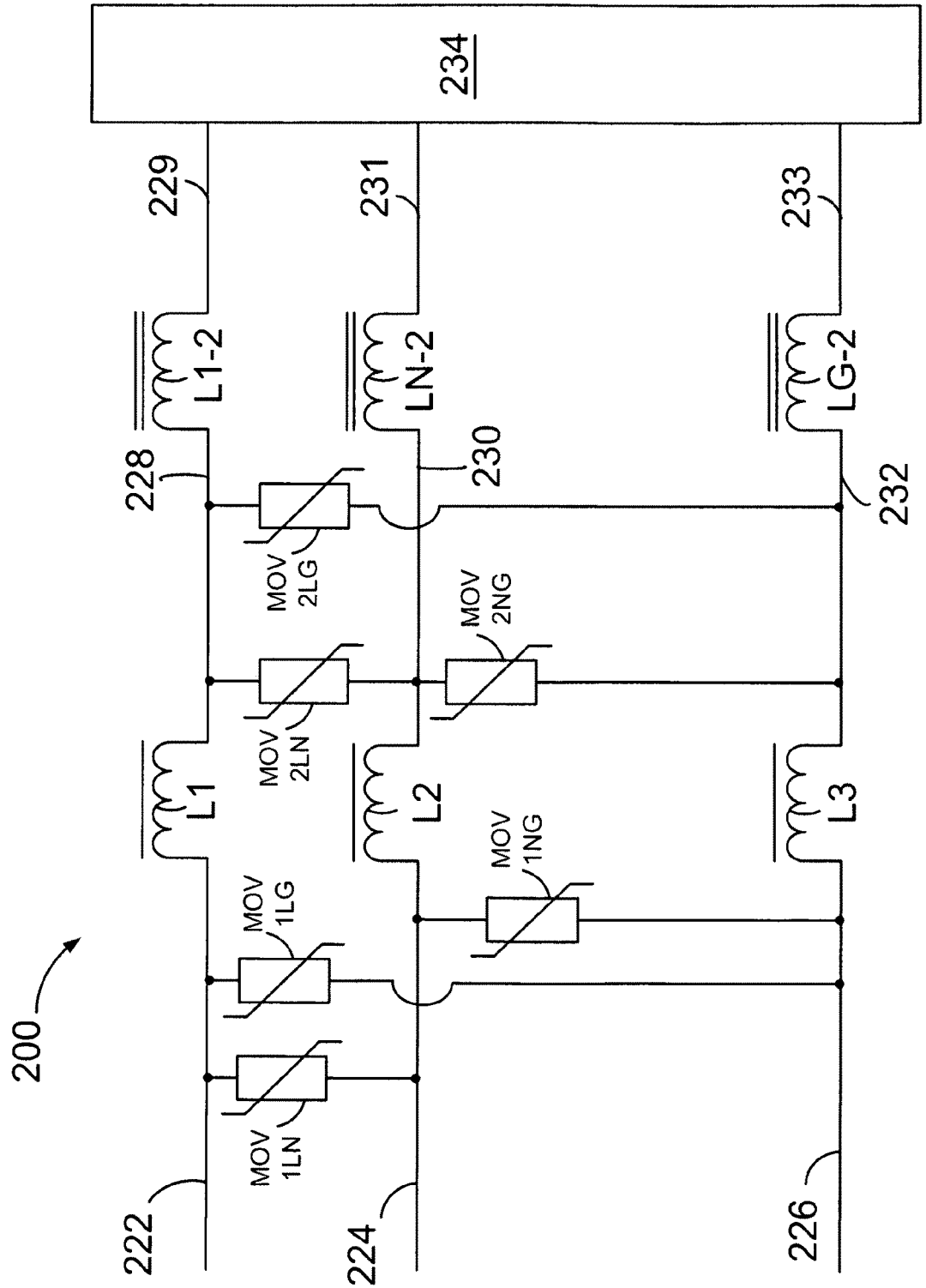

FIG. 14 is a schematic diagram of yet another embodiment employing a two-stage power conditioning circuit to a power source, using MOVs and inductors for the second-stage power conditioning. In this embodiment, smaller inductors L1, L2, and L3 may be employed in the first stage. The loss of inductance due to the reduced size of L1-L3 can be remedied by coupling inductors L1-2, LN-2, and LG-2 in series between the output lines 229 and L1, 231 and L2, and 233 and L3, respectively. The use of smaller inductors allows the power conditioning circuit 200 to be implemented in a smaller package than the panel shown in FIG. 3.

Figure 15:
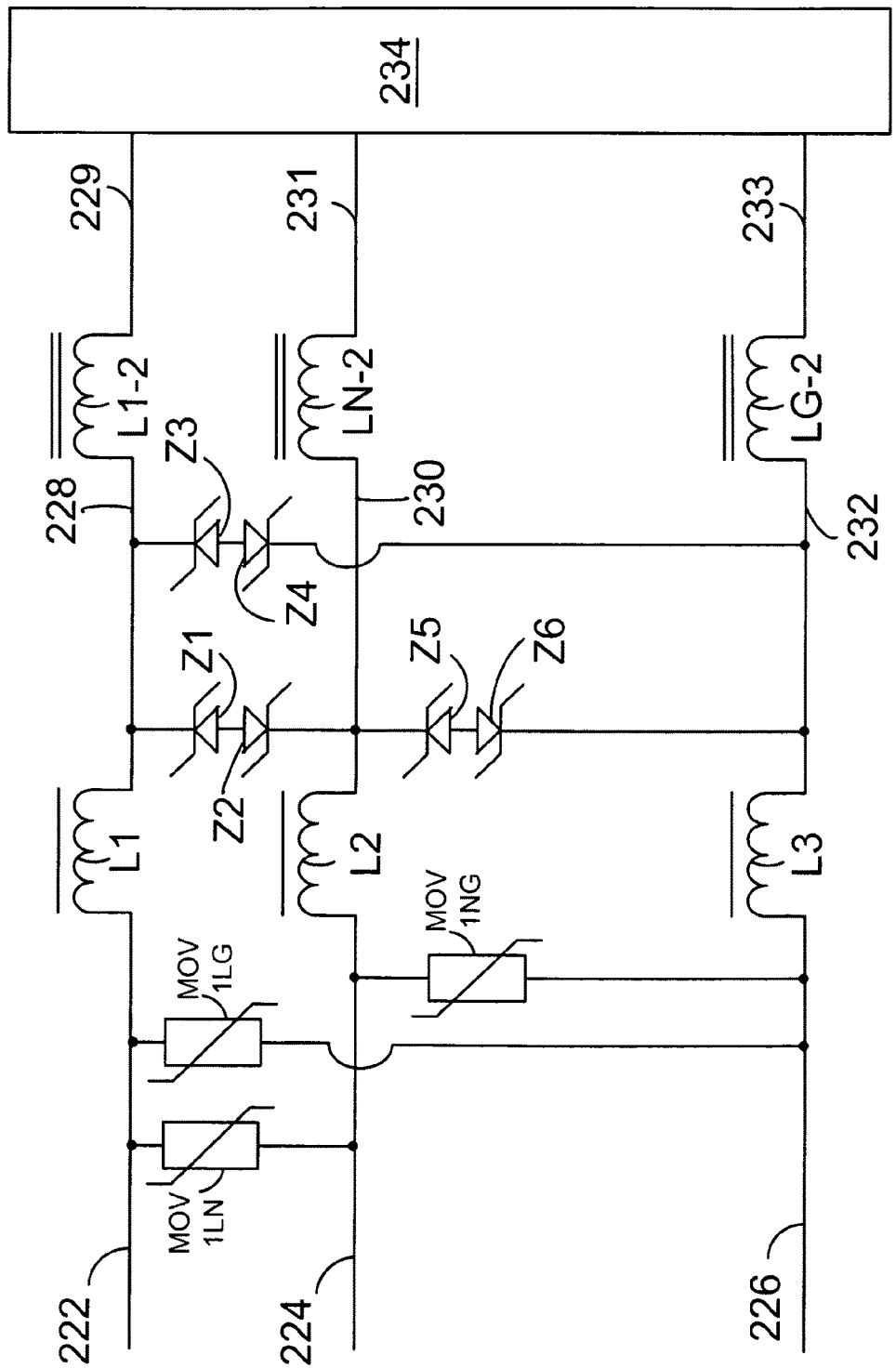

As seen in FIG. 15, some of the MOVs in FIG. 14 can be replaced by combinations of other voltage controlling devices, for example, back-to-back zener diodes Z1 and Z2 coupled in series across lines 228 and 230, Z3 and Z4 coupled in series across lines 228 and 232, and Z5 and Z6 coupled in series across lines 230 and 232.

Figure 16:
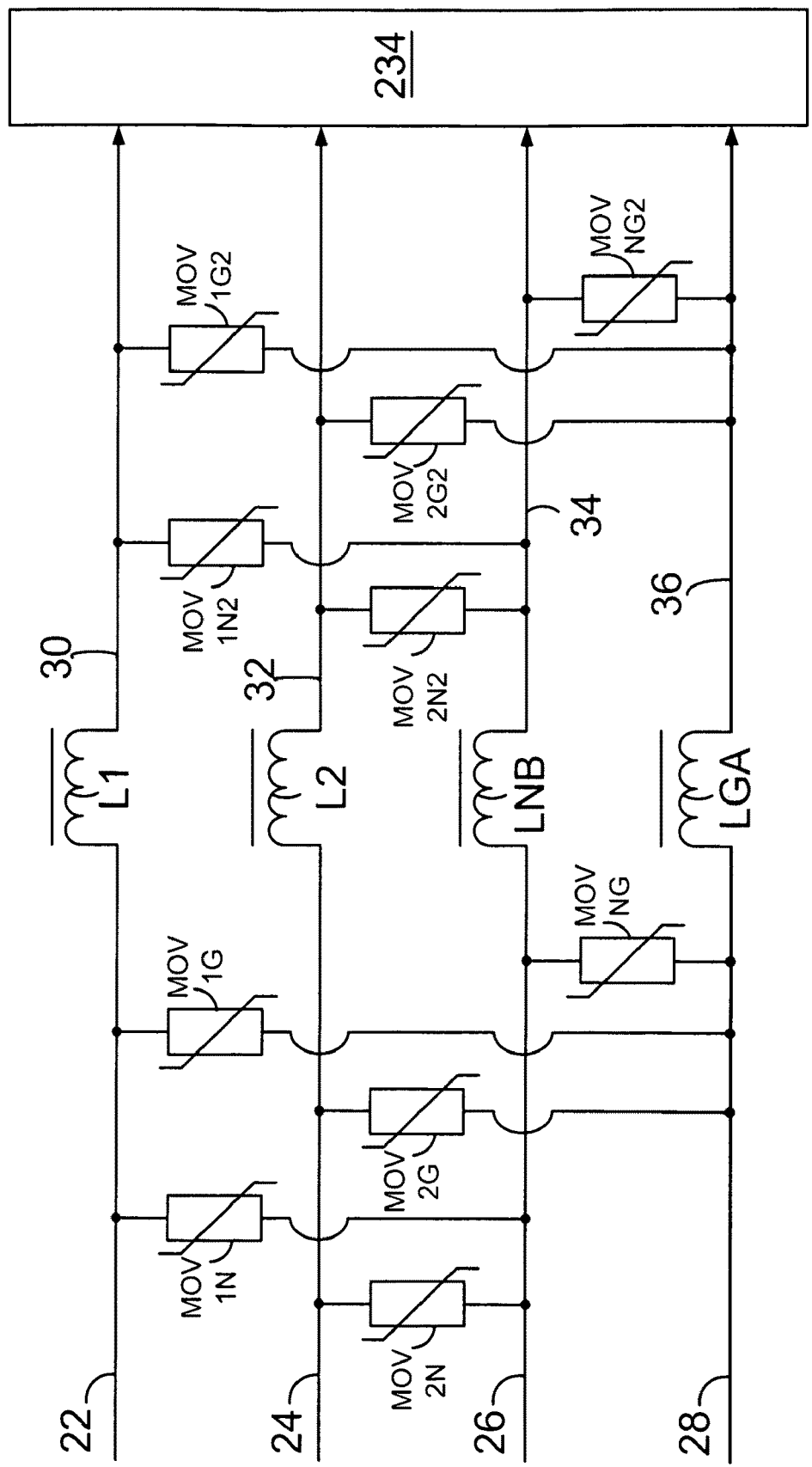

FIG. 16 is a schematic diagram of still yet another embodiment of the power conditioning circuit 200 of FIG. 14, wherein a two-stage power conditioning circuit is coupled to a 240V AC, split-Phase (two "Hot" lines) power supply, i.e., the first, second, neutral, and ground conductors 22, 24, 26, and 28. In this embodiment, the second stage comprises MOV1N2, MOV1G2, MOV2N2, MOV2G2, and MOVNG2 coupled across the output lines 30 and 32, 30 and 36, 32 and 34, 32 and 36, and 34 and 36, respectively.

Figure 17:
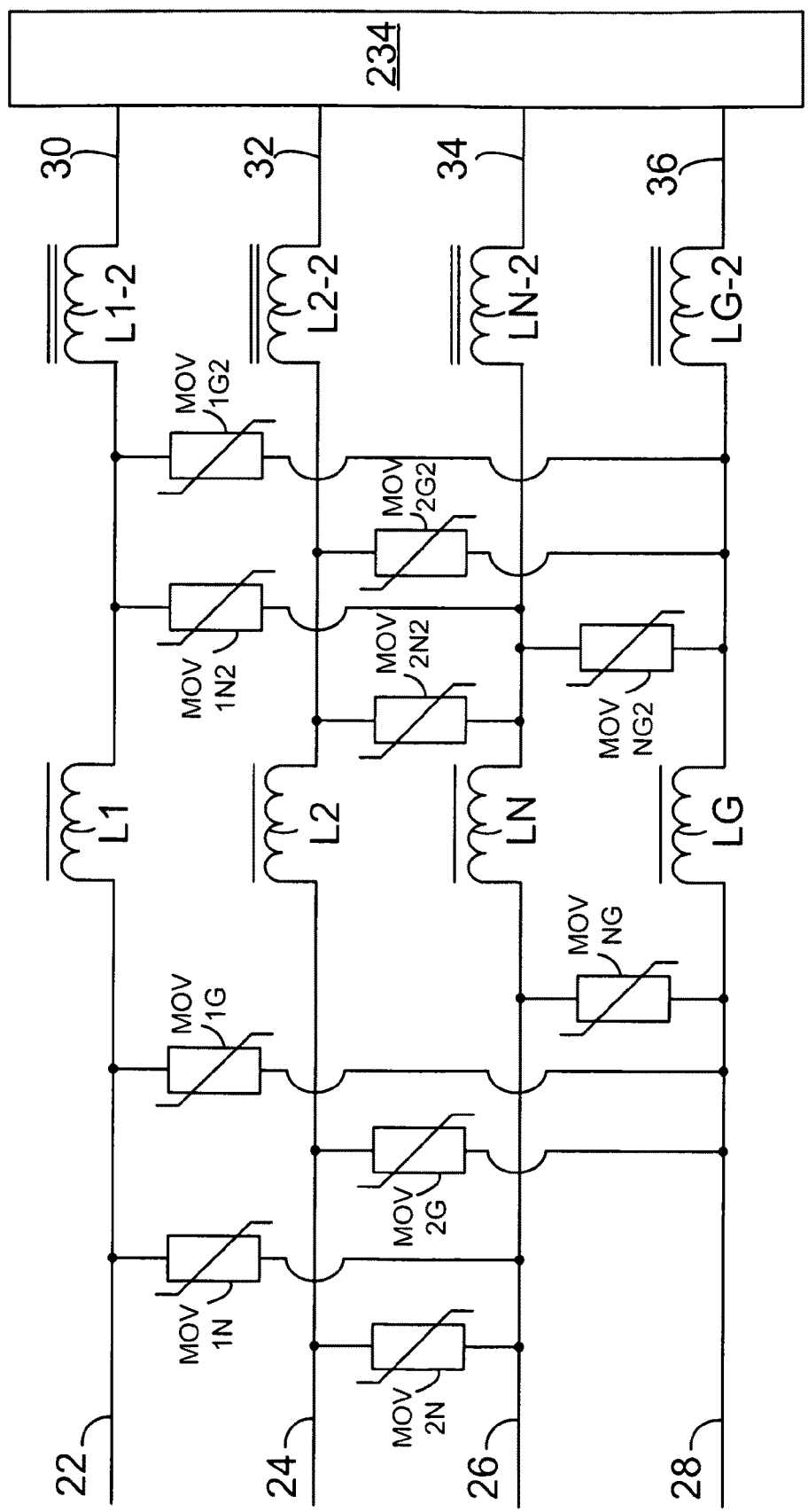

FIG. 17 is a schematic diagram of an alternative embodiment of the power conditioning circuit 200 similar to the embodiment of FIG. 16 except that inductors L1-1, L2-2, LN-2, and LG-2 are coupled between the first, second, neutral, and ground conductors 18, 28, 30, and 32 and the output lines 30, 32, 34, and 36, respectively.

Figure 18:
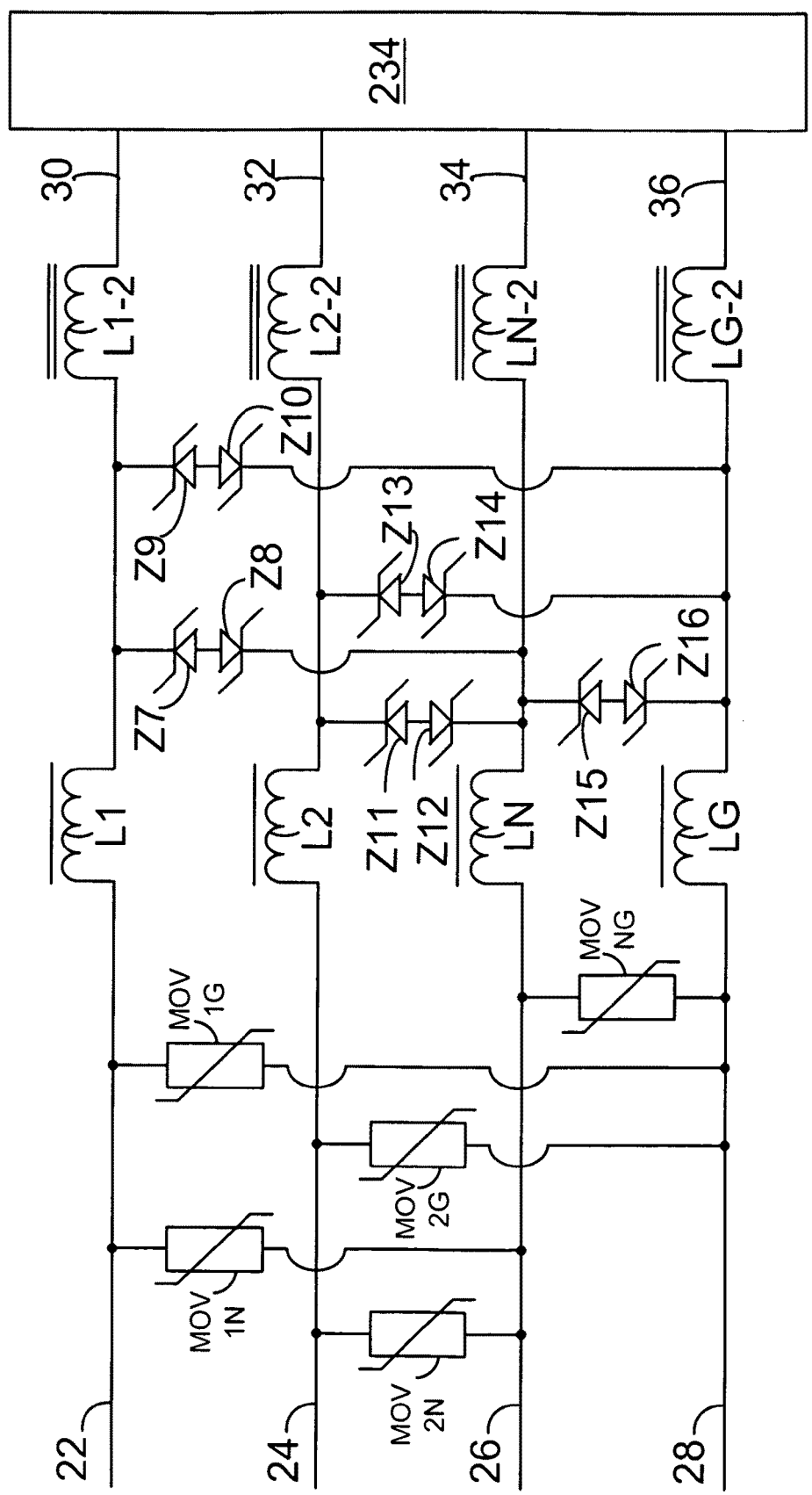

FIG. 18 is a schematic diagram of another embodiment of the power conditioning circuit 200 of FIG. 17, wherein the MOVs of the second stage are replaced by back-to-back series connected zener diodes Z7-Z16 to provide power conditioning at low current levels.

Figure 19:
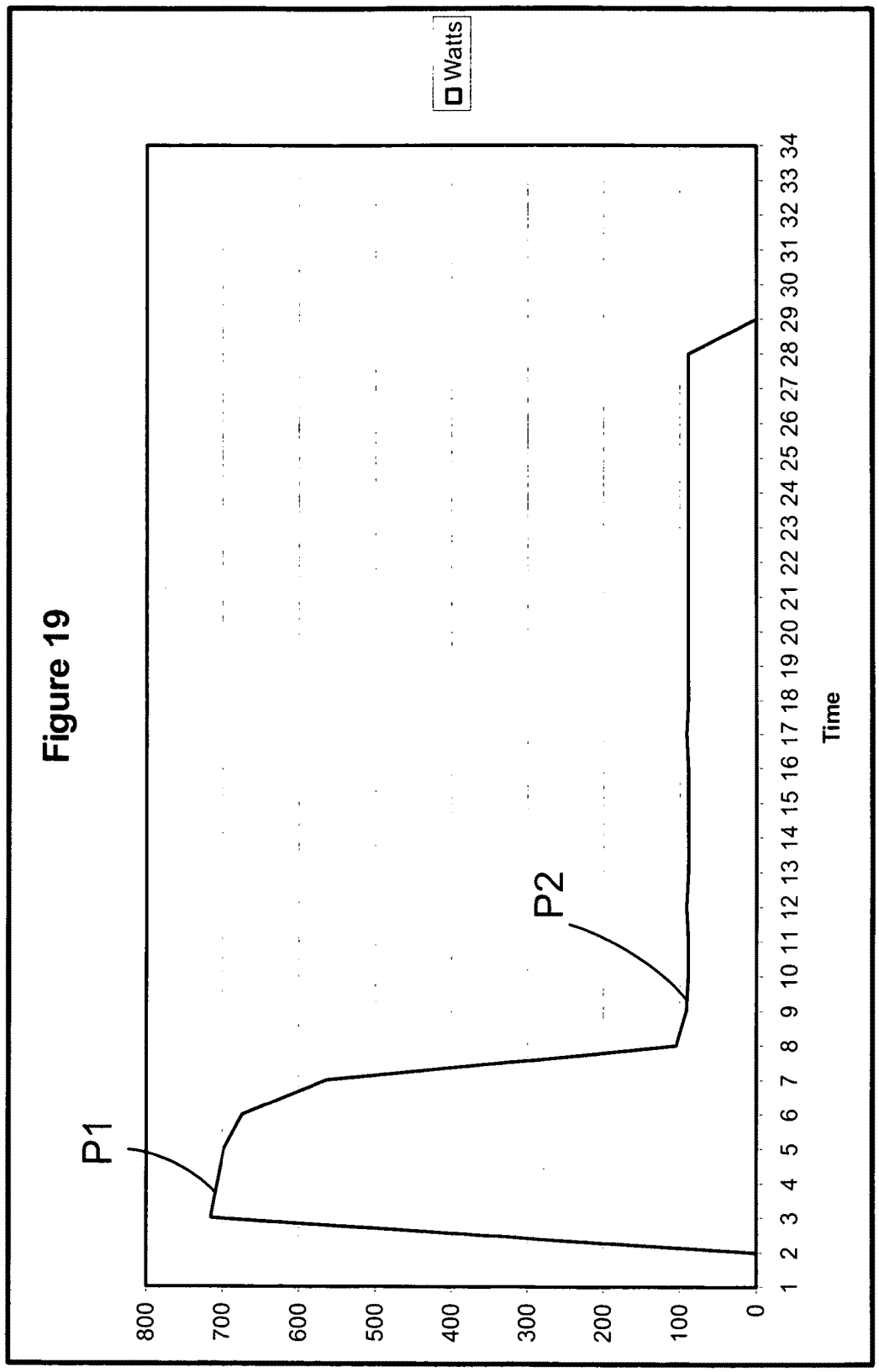
FIGS. 19 and 20 are screen shots of an oscilloscope displaying startup power consumption of a motor.
Figure 20:
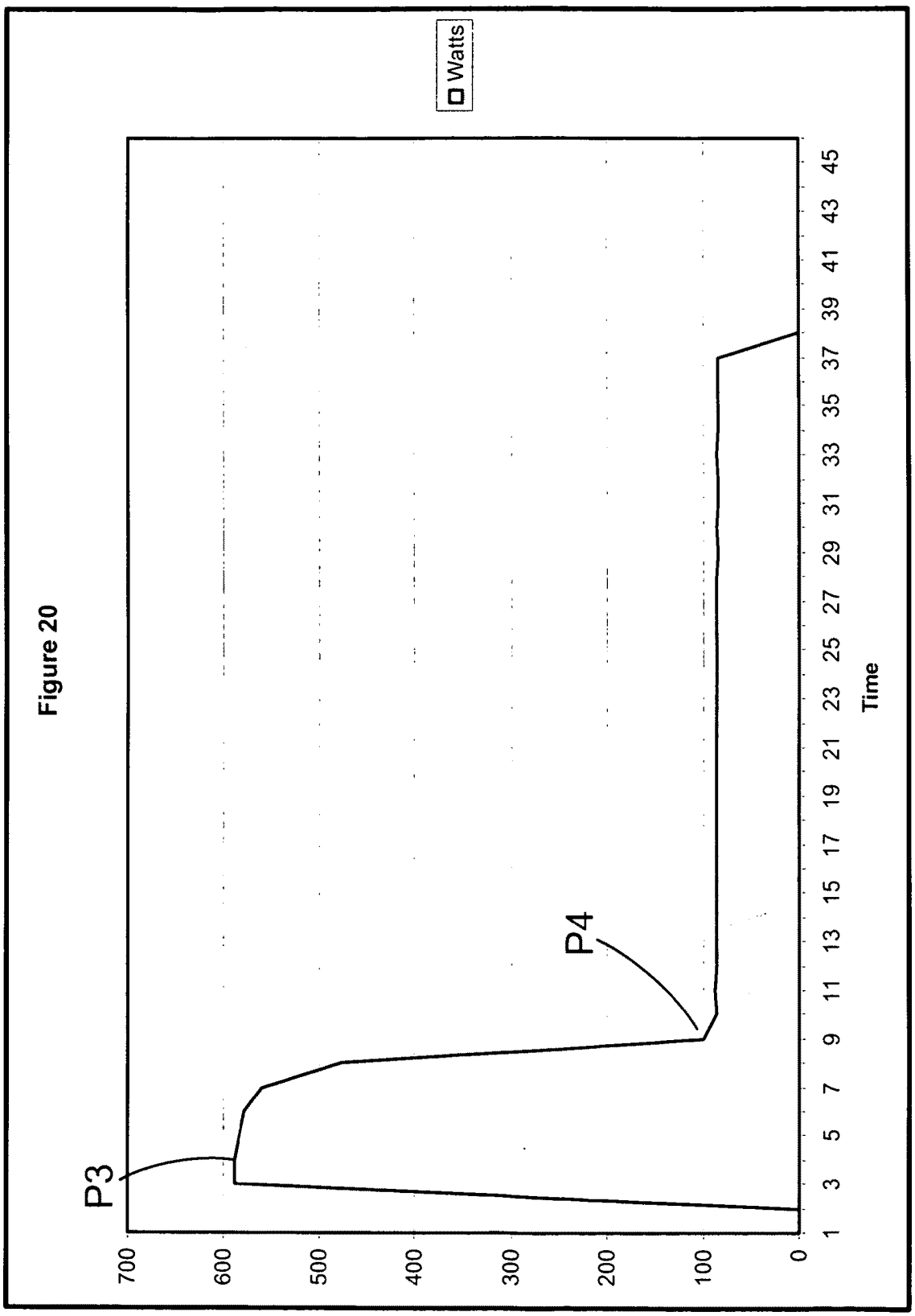

As shown in FIGS. 19 and 20, the power conditioning circuit 20 can be used to minimize a starting current demand of large loads, such as electric motors. FIG. 19 shows a plot of watts v. time for a standard 120V AC, 21 amp motor (not shown) that is connected to a power supply without the power conditioning circuit 20 while FIG. 20 shows a plot of watts v. time for the same load that is connected to the output lines 30, 32, 34, and 36 of the power conditioning circuit 20. P1 shown in FIG. 19 indicates that the motor consumes over 700 watts when it is initially turned on. Further, the motor continuously consumes about 160 watts at a steady state as indicated by P2. In contrast, the same motor that is connected to the power conditioning circuit 20 consumes less than 600 watts of power as shown by P3 when the motor is initially turned on and the motor consumes less than 100 watts of power at a steady state as indicated by P4. Over time, the reduced power consumption due to the use of the power conditioning circuit 20 can lead to significant cost savings.

Figure 21:
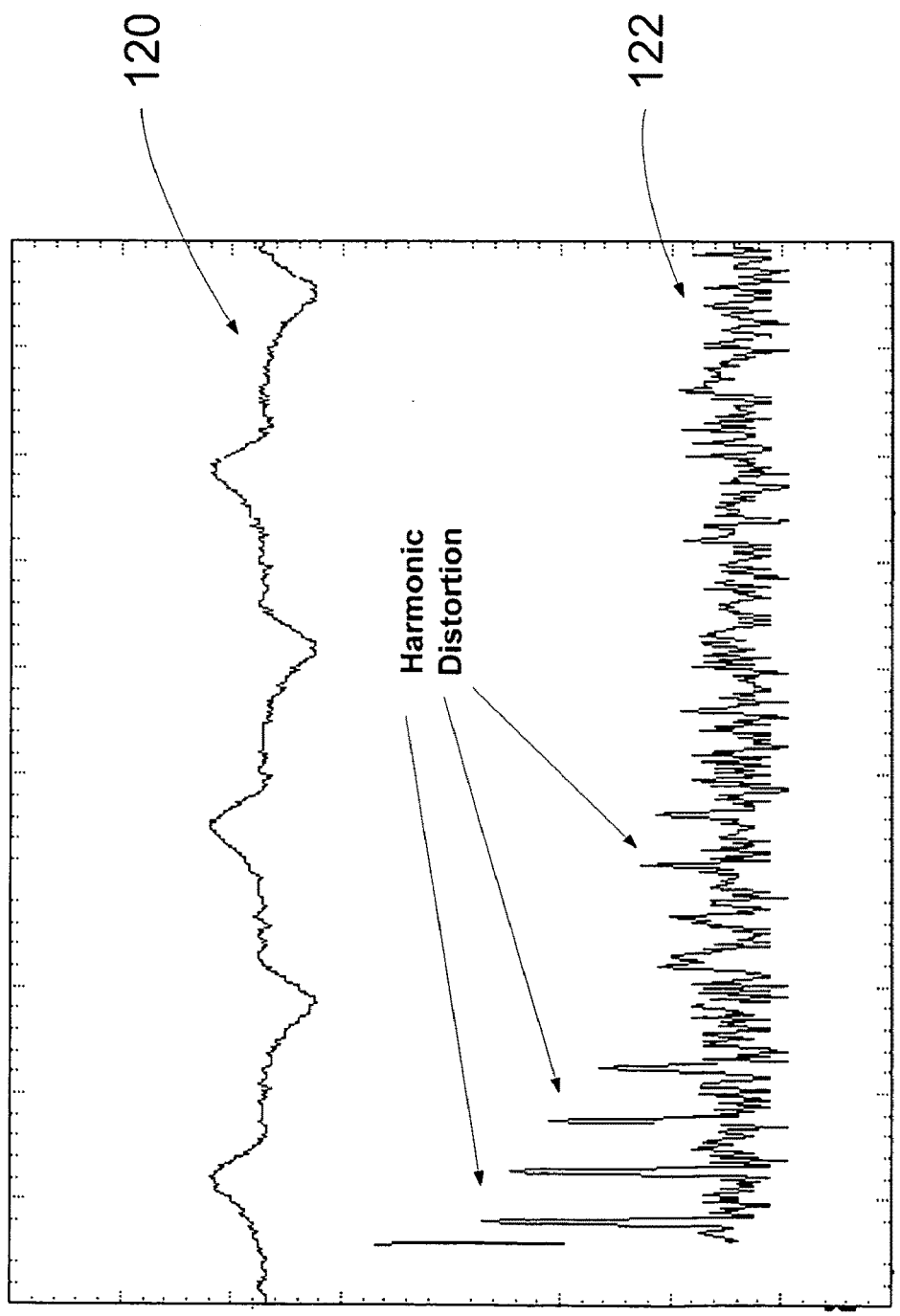
FIGS. 21 and 22 are screen shots of an oscilloscope displaying harmonic frequencies in a circuit.
Figure 22:
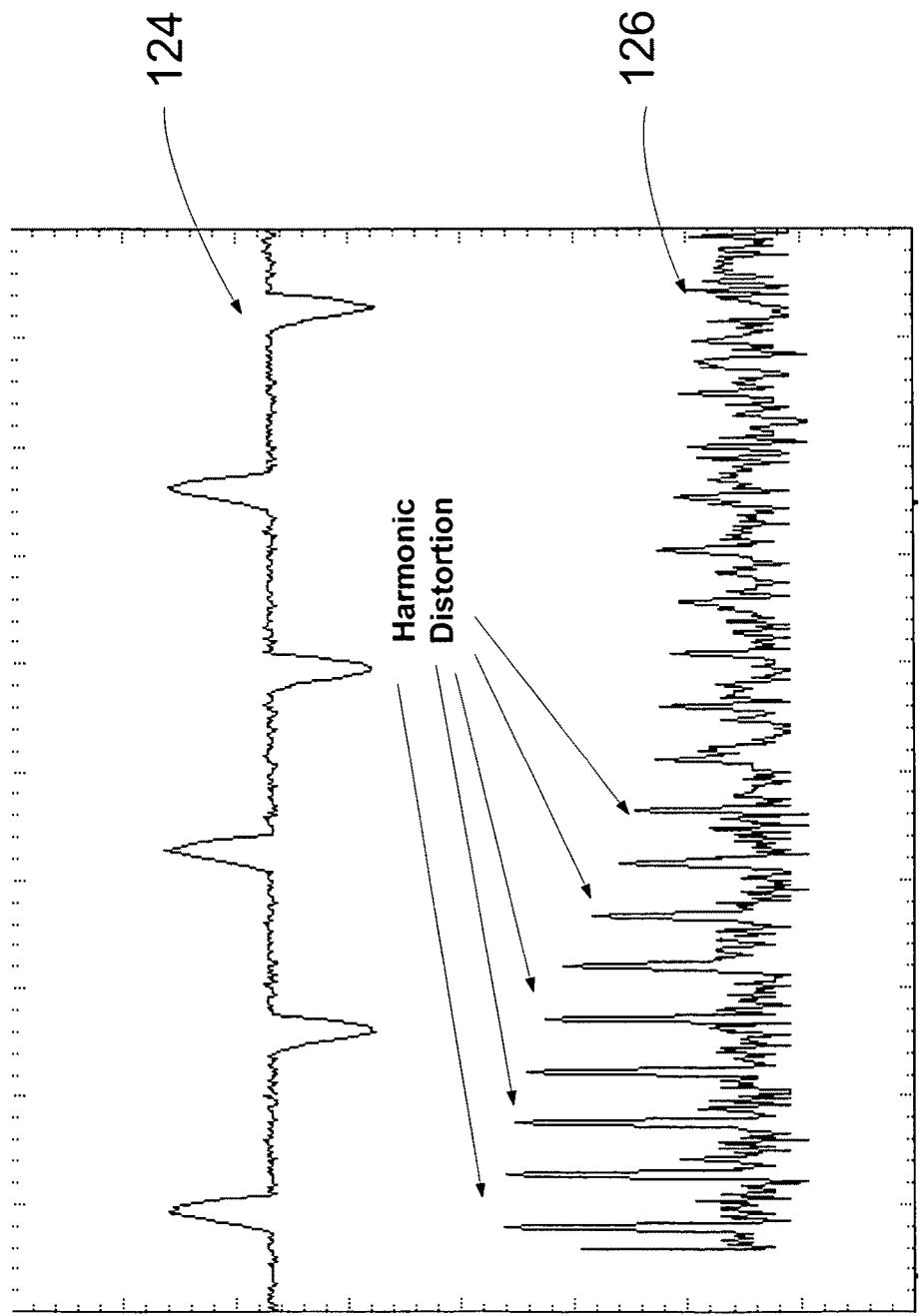

Turning now to FIGS. 21 and 22, it is shown that the power conditioning circuit 20 can be used to perform power factor correction. Specifically, FIG. 21 illustrates a waveform 120 and 122 that were measured downstream of the power conditioning circuit 20 while FIG. 22 illustrates waveforms 124, 126 that were measured at a power source (not shown). The waveforms 120 and 124 represent alternating current on the first conductor 22 while the waveforms 122 and 126 represent the harmonic distortion of the waveforms 120 and 124, respectively. It is pertinent to note that the waveform 122 that corresponds to an output of the power conditioning circuit 20 shows fewer high frequency harmonics than the waveform 126 that corresponds to the power source. Harmonic currents are unwanted energy components that generate heat in loads. As such, a load that is connected to the waveform 120 shown in FIG. 21 would require less cooling than a load that is connected to the waveform 124.

Numerous modifications and alternative embodiments of the power conditioning circuit described herein will be apparent to those skilled in the art in view of the foregoing description. Accordingly, this description is to be construed as illustrative only and is only for the purpose of teaching those skilled in the art the best mode of implementing the power conditioning circuit.

We claim:

1. A power conditioning circuit for conditioning power supplied by a power source at a nominal frequency over conductors in a polyphase system, comprising:
a first phase conductor;
a second phase conductor;
a first inductor connected in series between the first phase conductor and a first output line, wherein power supplied by the power source to the first output line flows through the first inductor; and
a second inductor connected in series between the second phase conductor and a second output line, wherein power supplied by the power source to the second output line flows through the second inductor;
wherein an inductance of each of the first inductor and the second inductor increases when power at frequencies greater than the nominal frequency flows through the first phase conductor and the second phase conductor, thereby blocking power at frequencies greater than the nominal frequency from reaching the first output line and the second output line.

2. The power conditioning circuit of claim 1, comprising:
a neutral conductor;
a ground conductor;
a third inductor connected in series between the neutral conductor and a third output line; and
a fourth inductor connected in series between the ground conductor and a fourth output line.

3. The power conditioning circuit of claim 2, comprising:
a first metal oxide varistor connected across the first phase conductor and the ground conductor to create a resistance between the first phase conductor and the ground conductor, wherein the resistance varies inversely with the magnitude of the voltage between the first phase conductor and the ground conductor; and
a second metal oxide varistor connected across the second phase conductor and the ground conductor.

4. The power conditioning circuit of claim 3, comprising:
a third metal oxide varistor connected across the first phase input conductors and the neutral conductor; and
a fourth metal oxide varistor connected across the second phase input conductor and the neutral conductor.

5. The power conditioning circuit of claim 4, comprising:
a fifth metal oxide varistor connected across the neutral conductor and the ground conductor.

6. The power conditioning circuit of claim 1, wherein the inductors each have an Oersted rating that is higher than a magnetic field driven by a maximum rated alternating current of the inductors.

7. The power conditioning circuit of claim 6, wherein the inductors having the high Oersted rating avoid saturation when driven by the maximum rated alternating current.

8. The power conditioning circuit of claim 1, comprising:
a capacitor connected across the first output line and the second output line.

9. A power conditioning circuit for conditioning power supplied by a power source at a nominal frequency over conductors in a polyphase system, comprising:
a first phase conductor;
a second phase conductor;
a first inductor connected in series between the first phase conductor and a first output line, wherein power supplied by the power source to the first output line flows through the first inductor;
a second inductor connected in series between the second phase conductor and a second output line, wherein power supplied by the power source to the second output line flows through the second inductor; and
a first metal oxide varistor connected across the first output line and the second output line;
wherein the first inductor and the second inductor have an increasing inductance with an increasing applied frequency and an oersted rating that is high enough to avoid saturation when driven by the maximum rated alternating current.

10. The power conditioning circuit of claim 9, comprising:
a second metal oxide varistor connected across the first phase conductor and the second phase conductor.

11. The power conditioning circuit of claim 10, comprising:
a third metal oxide varistor, wherein the second metal oxide varistor is connected across the first phase conductor and a ground conductor.

12. The power conditioning circuit of claim 11, comprising:
a fourth metal oxide varistor, wherein the third metal oxide varistor is connected across the second phase conductor and the ground conductor.

13. The power conditioning circuit of claim 9, comprising:
a third inductor connected in series with a ground conductor, wherein power supplied by the power source to the ground conductor flows through the third conductor.

14. The power conditioning circuit of claim 13, wherein the third inductor has an increasing inductance with an increasing applied frequency and an Oersted rating that is high enough to avoid saturation when driven by the maximum rated alternating current.

15. The power conditioning circuit of claim 9, comprising:
a second metal oxide varistor connected across the first output line and a ground conductor.

16. The power conditioning circuit of claim 15, comprising:
a third metal oxide varistor connected across the second output line and the ground conductor.

17. A power conditioning circuit for conditioning power supplied by a power source at a nominal frequency over conductors in a polyphase system, comprising:
a plurality of phase conductor inputs;
a plurality of phase conductor outputs;
a plurality of inductors, wherein each inductor, in the plurality of inductors, has an inductance that increases with frequency and each inductor is connected in series between a phase conductor input, in the plurality of phase conductor inputs, and a phase conductor output, in the plurality of phase conductor outputs; and
at least a first metal oxide varistor connected across two phase conductor inputs, in the plurality of phase conductor inputs;
wherein the first inductor and the second inductor have an increasing inductance with an increasing applied frequency.

18. The power conditioning circuit of claim 17, comprising:
at least a second metal oxide varistor connected across two phase conductor outputs, in the plurality of phase conductor outputs.

19. The power conditioning circuit of claim 17, comprising:
a ground line input;
a ground line output;
a ground line inductor connected in series between the ground line input and the ground line output; and
at least a second metal oxide varistor connected across the ground line input and a phase conductor input, in the plurality of phase conductor inputs.

20. The power conditioning circuit of claim 17, comprising:
a neutral line input;
a neutral line output;
a neutral line inductor connected in series between the neutral line input and the neutral line output; and
at least a second metal oxide varistor connected across the neutral line input and a phase conductor input, in the plurality of phase conductor inputs.

* * * * *